US012672296B2

(12) United States Patent
Rock et al.

(10) Patent No.: US 12,672,296 B2
(45) Date of Patent: Jun. 30, 2026

(54) METHOD TO SUPPRESS BASE POLY LINKUP OVERGROWTH INTO THE EMITTER CAVITY DURING SILICON GERMANIUM SELECTIVE EPITAXY GROWTH

(71) Applicant: Texas Instruments Incorporated, Dallas, TX (US)

(72) Inventors: Jerald Rock, Lisbon, ME (US); Thomas Moutinho, Gorham, ME (US); Tatsuya Tominari, Plano, TX (US); Thanas Budri, Portland, ME (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 318 days.

(21) Appl. No.: 18/499,153

(22) Filed: Oct. 31, 2023

(65) Prior Publication Data

US 2025/0142851 A1 May 1, 2025

(51) Int. Cl.
| | |
|---|---|
| *H01L 29/66* | (2006.01) |
| *H01L 21/02* | (2006.01) |
| *H01L 21/3065* | (2006.01) |
| *H01L 29/08* | (2006.01) |
| *H01L 29/10* | (2006.01) |

(Continued)

(52) U.S. Cl.
CPC ......... *H10D 10/021* (2025.01); *H10D 10/821* (2025.01); *H10D 62/136* (2025.01); *H10D 62/137* (2025.01); *H10D 62/177* (2025.01); *H10P 14/27* (2026.01); *H10P 14/3411* (2026.01); *H10P 50/242* (2026.01)

(58) Field of Classification Search
CPC ........ H01L 21/02532; H01L 21/02639; H10D 10/021; H10D 10/821; H10D 10/891; H10D 62/136; H10D 62/137; H10D 62/177; H10D 62/822; H10P 14/27; H10P 14/3411; H10P 50/242
See application file for complete search history.

(56) References Cited

U.S. PATENT DOCUMENTS

| | | | |
|---|---|---|---|
| 5,962,880 A | 10/1999 | Oda et al. | |
| 2001/0053584 A1* | 12/2001 | Chantre | ............... H10D 10/891 |
| | | | 438/424 |

(Continued)

*Primary Examiner* — David C Spalla
(74) *Attorney, Agent, or Firm* — Andrew R. Ralston; Frank D. Cimino

(57) ABSTRACT

A semiconductor device includes a heterojunction bipolar transistor (HBT) having a collector, a base, and an emitter. The base includes a monocrystalline base layer, including silicon-germanium, on the collector, and an extrinsic base layer, including polycrystalline silicon, extending partway over the monocrystalline base layer. The base further includes a base link, including polycrystalline silicon-germanium, connecting the monocrystalline base layer to the extrinsic base layer. An emitter spacer, of dielectric material, laterally separates the emitter from the extrinsic base layer. The HBT has a spacer-extrinsic base vertical offset between a bottom of the emitter spacer and a bottom surface of the extrinsic base layer adjacent to the emitter spacer. The emitter spacer has a bottom width at a bottom of the emitter spacer. A sum of the spacer-extrinsic base vertical offset and the bottom width of the emitter spacer is greater than the thickness of the monocrystalline base layer.

20 Claims, 44 Drawing Sheets

(51) Int. Cl.

| | |
|---|---|
| *H01L 29/737* | (2006.01) |
| *H10D 10/01* | (2025.01) |
| *H10D 10/80* | (2025.01) |
| *H10D 62/13* | (2025.01) |
| *H10D 62/17* | (2025.01) |
| *H10P 14/20* | (2026.01) |
| *H10P 50/24* | (2026.01) |

(56)  References Cited

U.S. PATENT DOCUMENTS

| | | | |
|---|---|---|---|
| 2005/0048735 A1* | 3/2005 | Khater ................. | H10D 62/177 |
| | | | 257/E29.183 |
| 2019/0305119 A1* | 10/2019 | John .................... | H10D 10/051 |
| 2024/0204086 A1* | 6/2024 | John .................... | H10D 10/821 |
| 2025/0098189 A1* | 3/2025 | John .................... | H10D 10/821 |

* cited by examiner

216

214

212

208

218

P

202

206

2B

204

200

216

214

212

210

208

METHOD TO SUPPRESS BASE POLY LINKUP OVERGROWTH INTO THE EMITTER CAVITY DURING SILICON GERMANIUM SELECTIVE EPITAXY GROWTH

TECHNICAL FIELD

This disclosure relates to the field of semiconductor devices. More particularly, but not exclusively, this disclosure relates to heterojunction bipolar transistors in semiconductor devices.

BACKGROUND

Heterojunction bipolar transistors (HBTs) in semiconductor devices are important components that find extensive use in high-frequency and high-power applications, such as wireless communication systems and power amplifiers, due to their superior performance characteristics. The HBT is a type of bipolar junction transistor which uses differing semiconductor materials for the emitter and base regions, creating a heterojunction. The HBT improves on a homojunction bipolar junction transistor, which have the same semiconductor material for both the emitter and the base regions, in that it can handle signals of higher frequencies, up to several hundred GHz. HBTs exploit the advantages of interfaces between different semiconductor materials with differing bandgap energies. This difference in bandgap energies enables HBTs to exhibit higher carrier mobility, reduced base transit time, and improved frequency response. Researchers have explored various semiconductor materials, epitaxial growth techniques, and device geometries to optimize HBTs for specific applications. While these efforts have led to significant improvements, challenges such as reducing manufacturing complexities and costs associated with HBT integration while attaining desired levels of power efficiency, miniaturization, and heat management remain.

SUMMARY

A semiconductor device includes a fully self-aligned (FSA) selective epitaxial growth (SEG) heterojunction bipolar transistor (HBT), hereinafter the HBT, having a collector, a base on the collector, and an emitter on the base. The collector includes monocrystalline silicon. The base includes a monocrystalline base layer, including monocrystalline silicon-germanium, on the collector, and an extrinsic base layer, including polycrystalline silicon, extending partway over the monocrystalline base layer. The base further includes a base link, including polycrystalline silicon-germanium, vertically connecting the monocrystalline base layer to the extrinsic base layer. The HBT further includes an emitter spacer, of dielectric material, laterally separating the emitter from the extrinsic base layer. The monocrystalline base layer extends laterally past the emitter spacer, under the polycrystalline silicon extrinsic base layer. The HBT has a spacer-extrinsic base vertical offset between a bottom of the emitter spacer and a bottom surface of the extrinsic base layer adjacent to the emitter spacer. The emitter spacer has a bottom width at a bottom of the emitter spacer, closest to the monocrystalline base layer. A sum of the spacer-extrinsic base vertical offset and the bottom width of the emitter spacer is greater than the thickness of the monocrystalline base layer. The base link laterally abuts the emitter spacer opposite from the emitter.

DETAILED DESCRIPTION

Figure 1A:
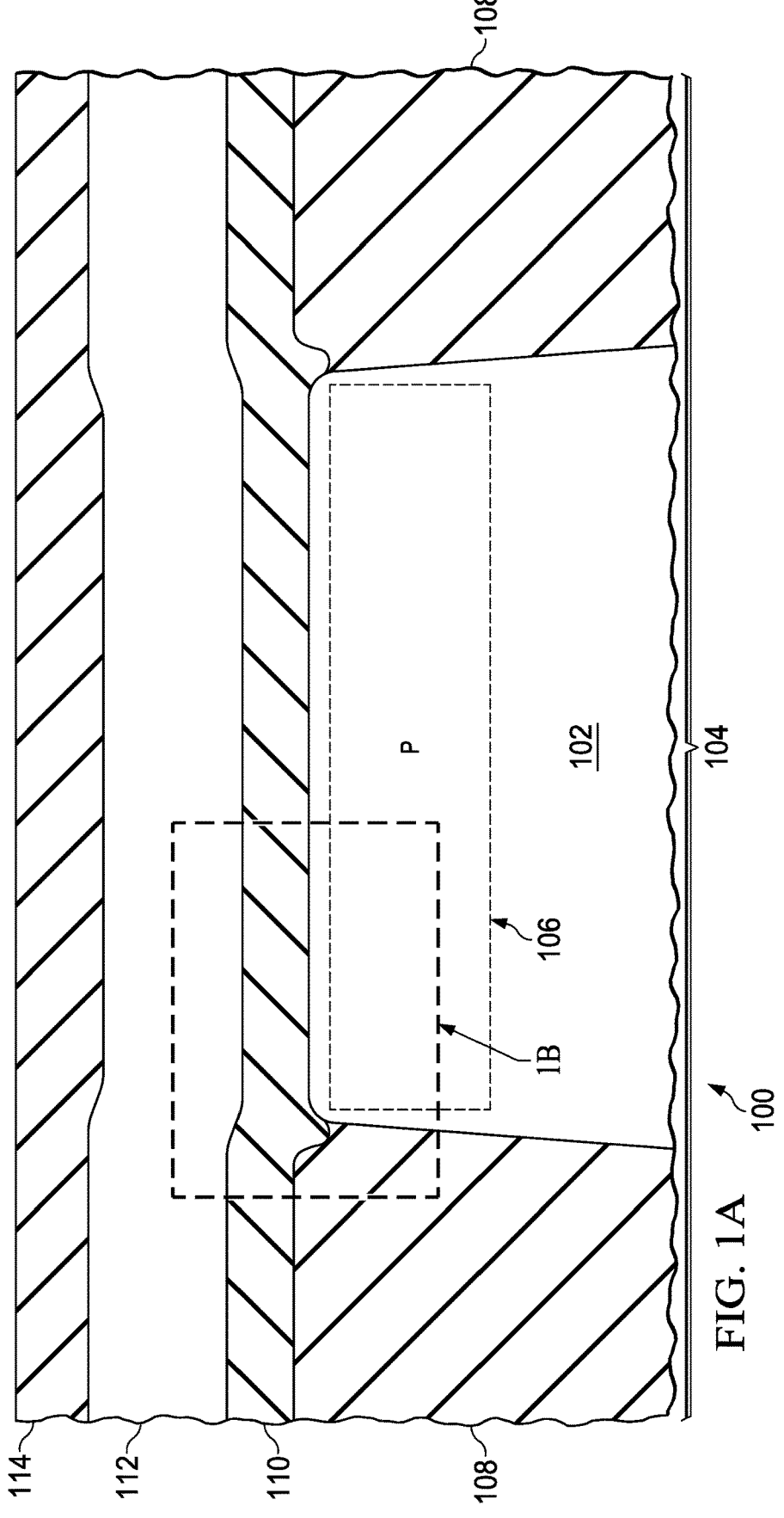
FIG. 1A through FIG. 1T are cross-sections of an example semiconductor device having an HBT, depicted in stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the examples illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present disclosure is illustrated by examples directed to active devices, it is not intended that these illustrations be a limitation on the scope or applicability of the present disclosure. Furthermore, it is not intended that the scope active devices of the present disclosure be limited to the physical structures illustrated. These structures are included to demonstrate the utility and application of various implementations.

A semiconductor device, for example, an integrated circuit, includes a heterojunction bipolar transistor (HBT) having a collector, a base, and an emitter. The collector includes monocrystalline silicon, and has a first conductivity type.

The base includes an intrinsic monocrystalline base layer on the collector, contacting the monocrystalline silicon of the collector. The monocrystalline base layer includes monocrystalline silicon-germanium, and may include monocrystalline silicon. The base also includes an extrinsic base layer, extending partway over the monocrystalline base layer. The extrinsic base layer includes polycrystalline silicon. The base further includes a base link which connects the extrinsic base layer to the monocrystalline base layer. The base link includes polycrystalline silicon-germanium. If the monocrystalline base layer includes monocrystalline silicon, the base link includes polycrystalline silicon. The monocrystalline base layer, the extrinsic base layer, and the base link have a second conductivity type, opposite from the first conductivity type.

The emitter includes silicon, and has the first conductivity type. The HBT further includes an emitter spacer of dielectric material which laterally separates the emitter from the extrinsic base layer. The emitter spacer is electrically nonconductive. The emitter spacer has a bottom width at a bottom of the emitter spacer, closest to the monocrystalline base layer. The monocrystalline base layer extends laterally past the emitter spacer, under the extrinsic base layer.

The HBT has a spacer-extrinsic base vertical offset, which is a vertical distance between a bottom of the emitter spacer and a bottom surface of the extrinsic base layer adjacent to the emitter spacer. The emitter spacer has a bottom width, which is a width of the emitter spacer at a bottom of the emitter spacer, closest to the monocrystalline base layer. A sum of the spacer-extrinsic base vertical offset and the bottom width of the emitter spacer is greater than a thickness of the monocrystalline base layer, referred to herein as the base thickness. The base link laterally abuts the emitter spacer opposite from the emitter.

In some aspects, the spacer-extrinsic base vertical offset is less than the base thickness. In some aspects, a bottom surface of the extrinsic base layer, in contact with the base link, is recessed. In some aspects, a boundary between the extrinsic base layer and the base link is flat and parallel to a top surface of the collector.

For the purposes of this disclosure, the term "vertical" refers to a direction perpendicular to a planar portion of a top surface of the collector, that is, a planar portion of a boundary between the collector and the monocrystalline base layer. The term "lateral" refers to a direction parallel to the planar portion of the top surface of the collector.

Figure 1B:
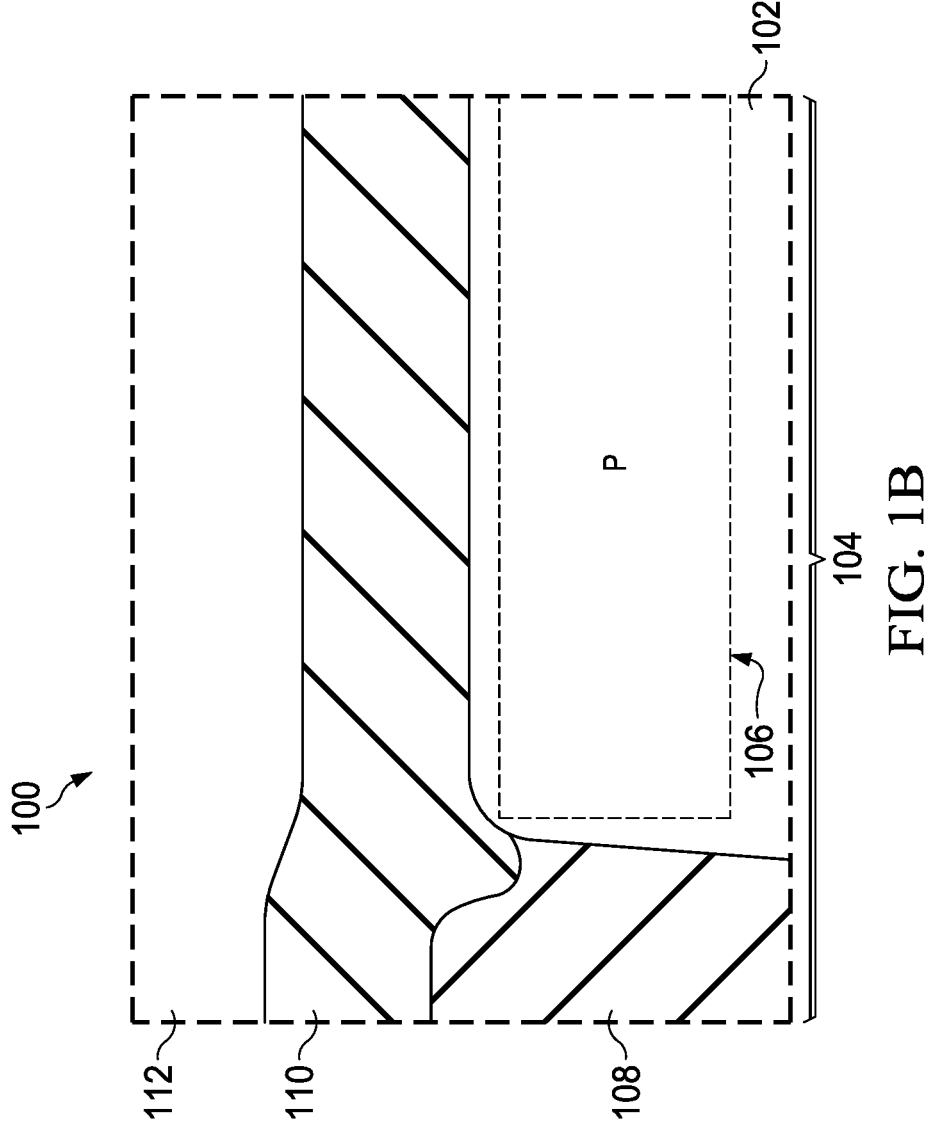
Figure 1C:
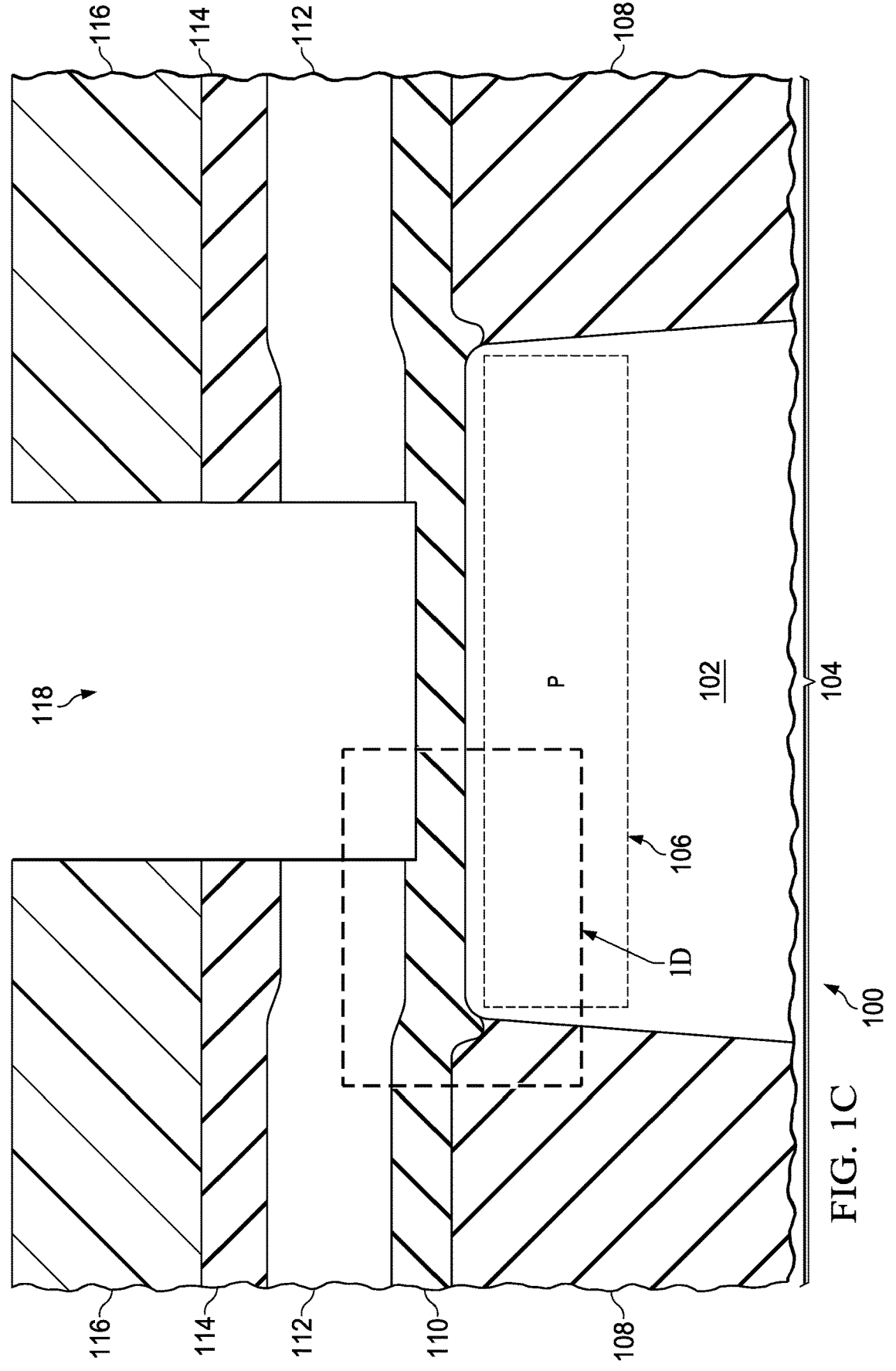
Figure 1D:
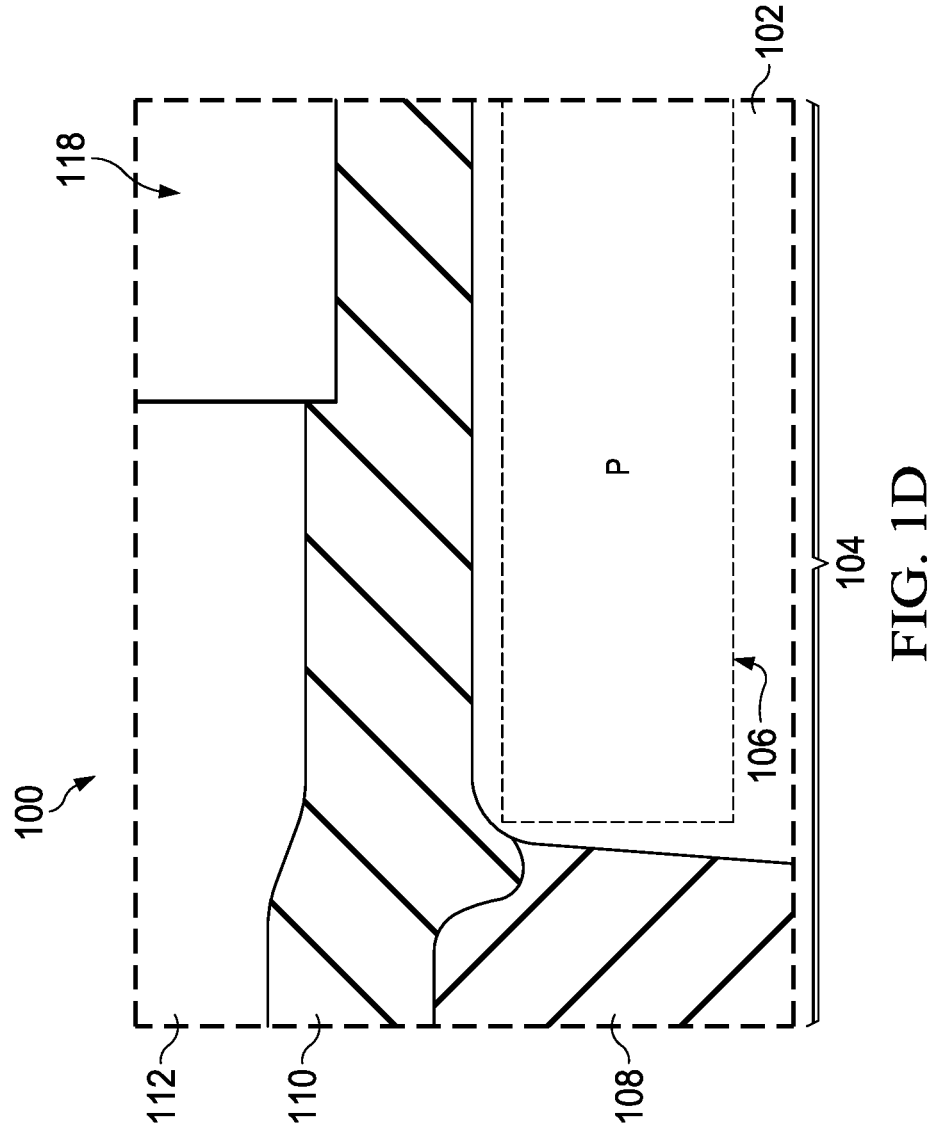
Figure 1E:
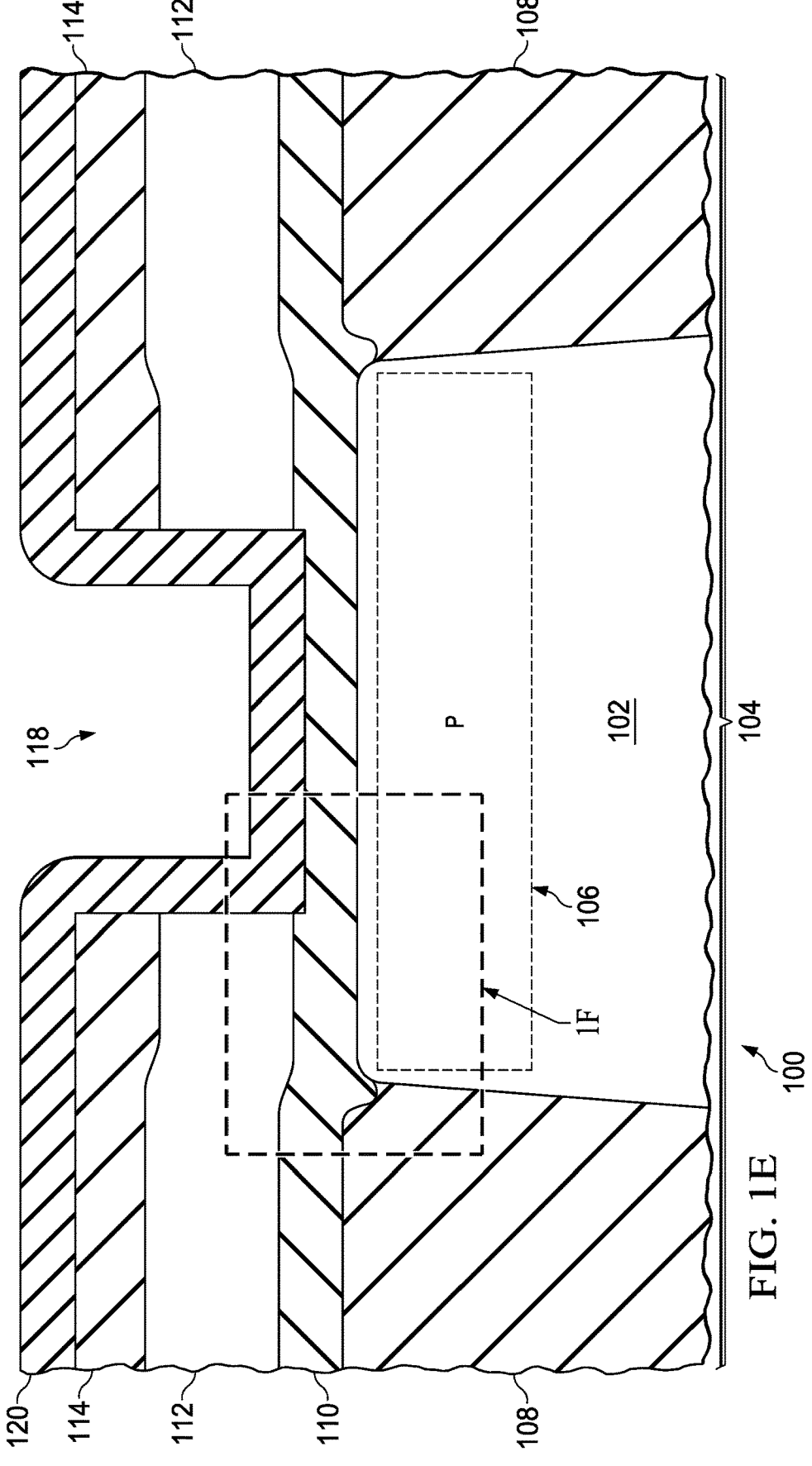
Figure 1F:
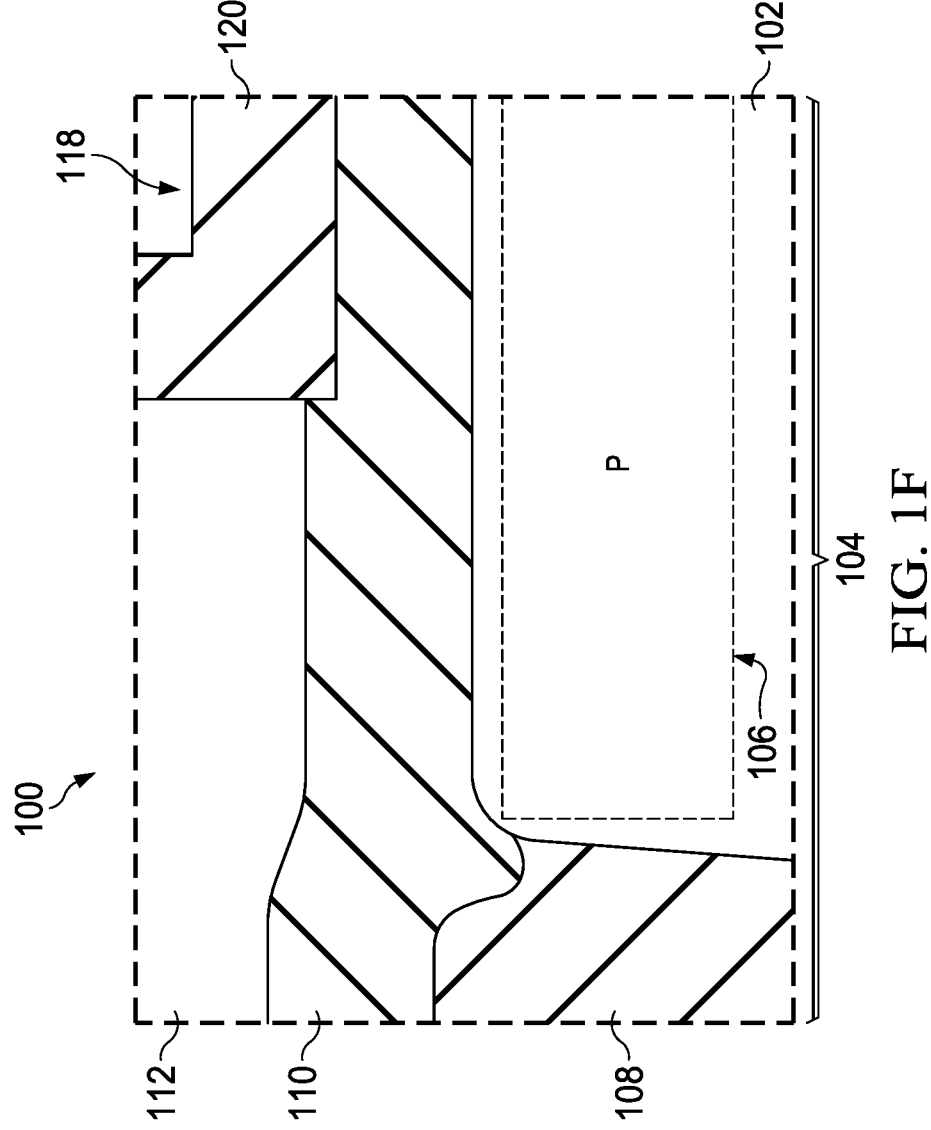
Figure 1G:
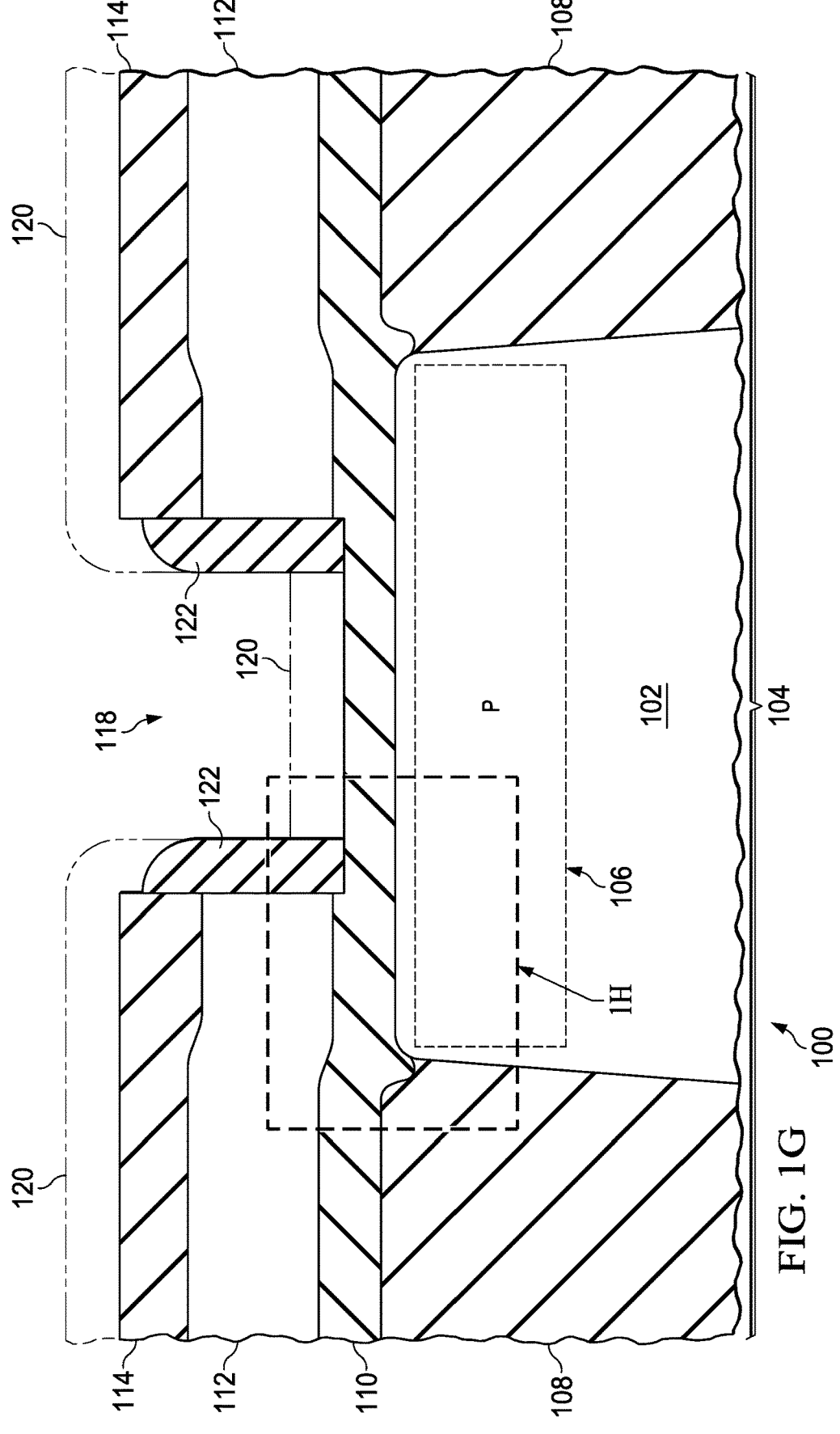
Figure 1H:
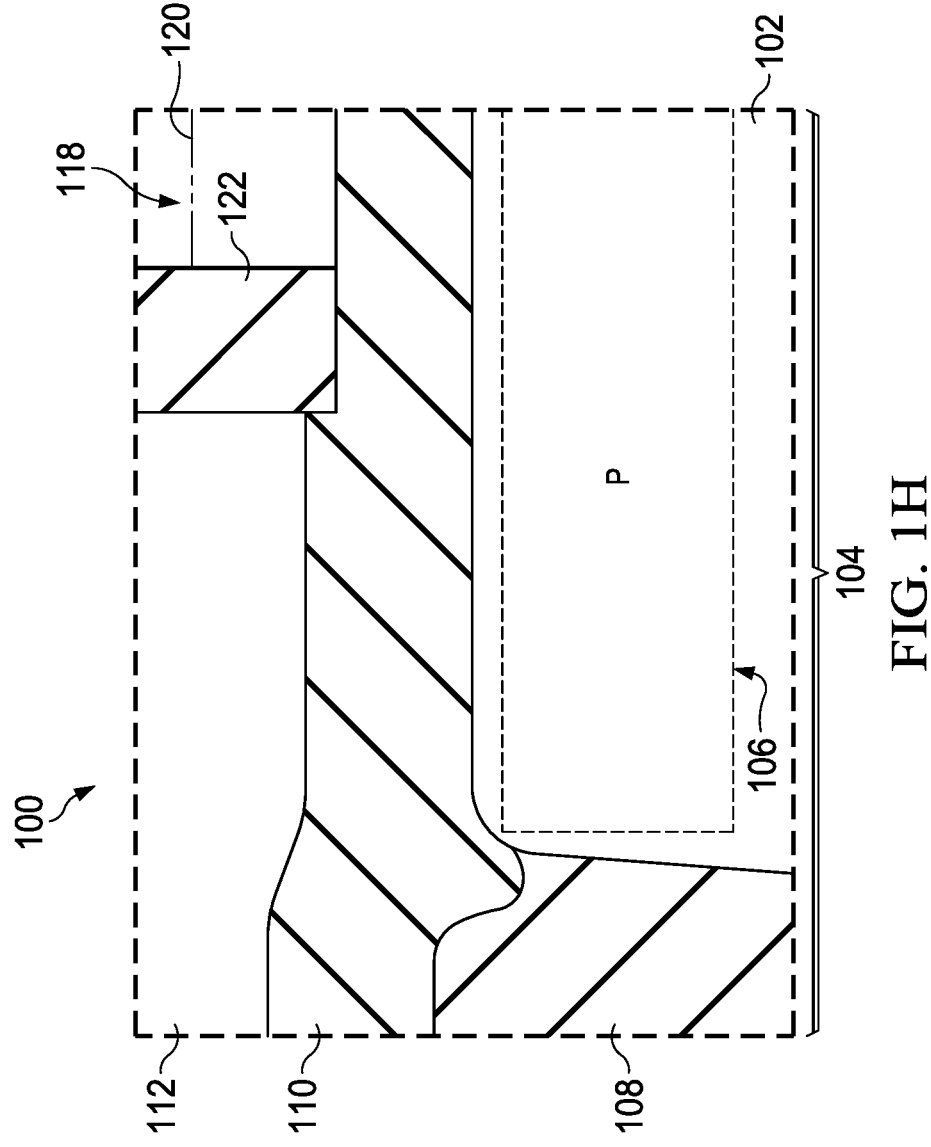
Figure 1I:
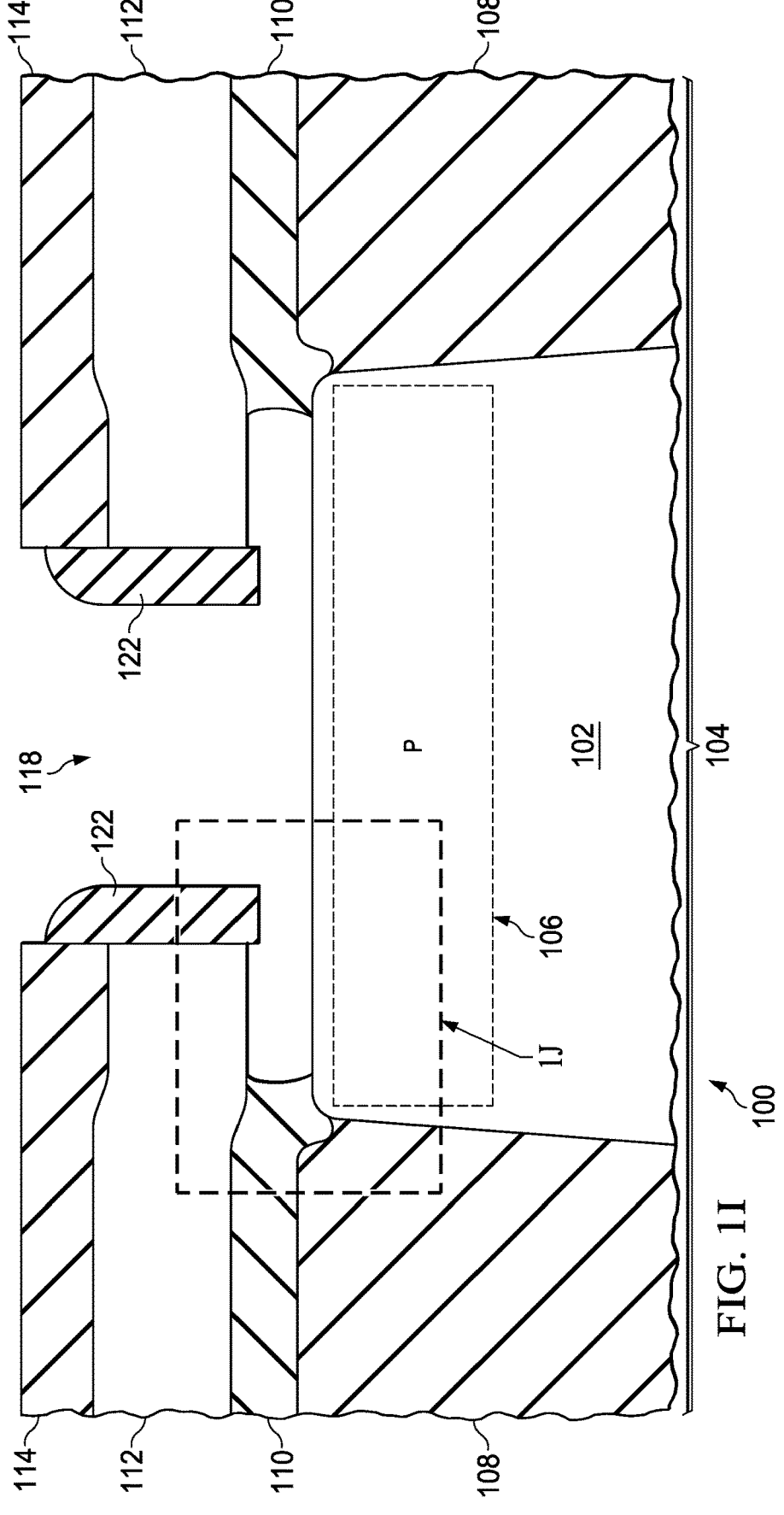
Figure 1J:
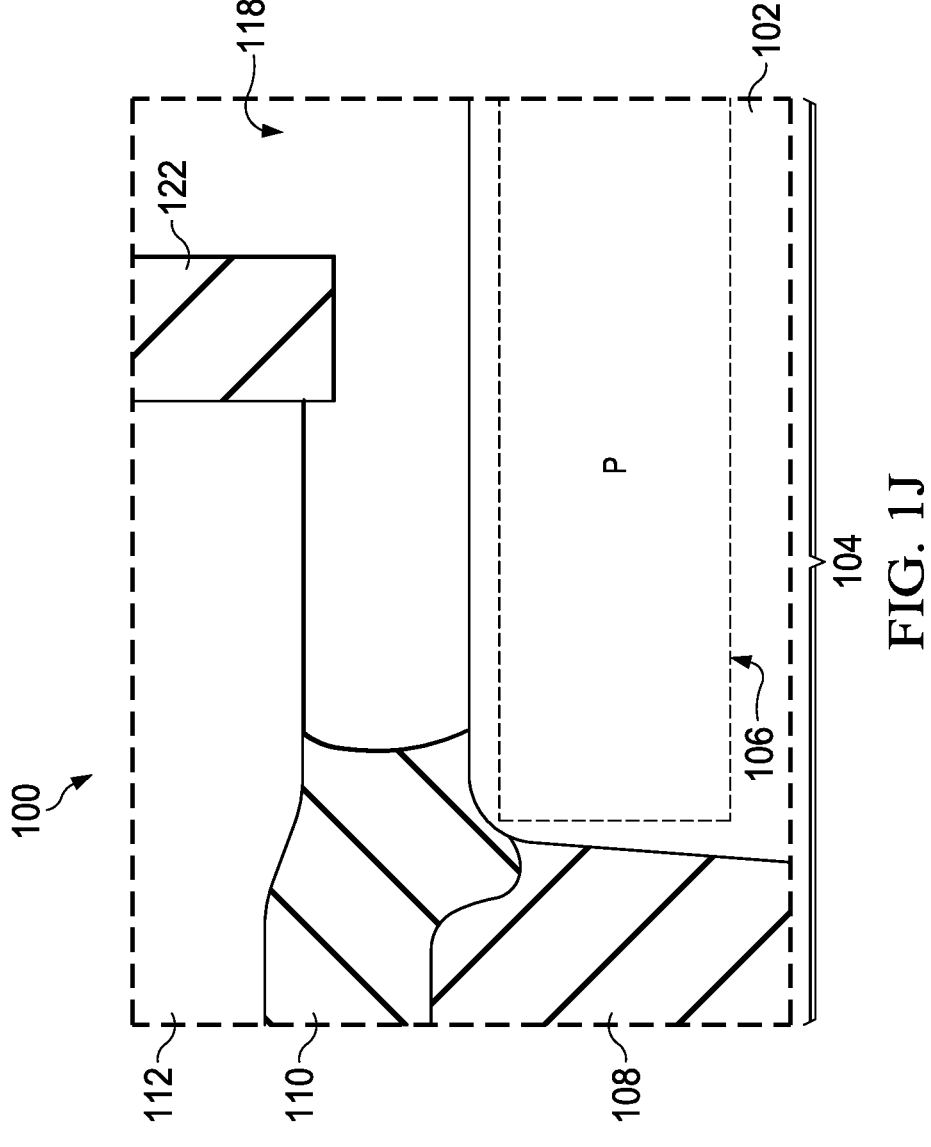
Figure 1K:
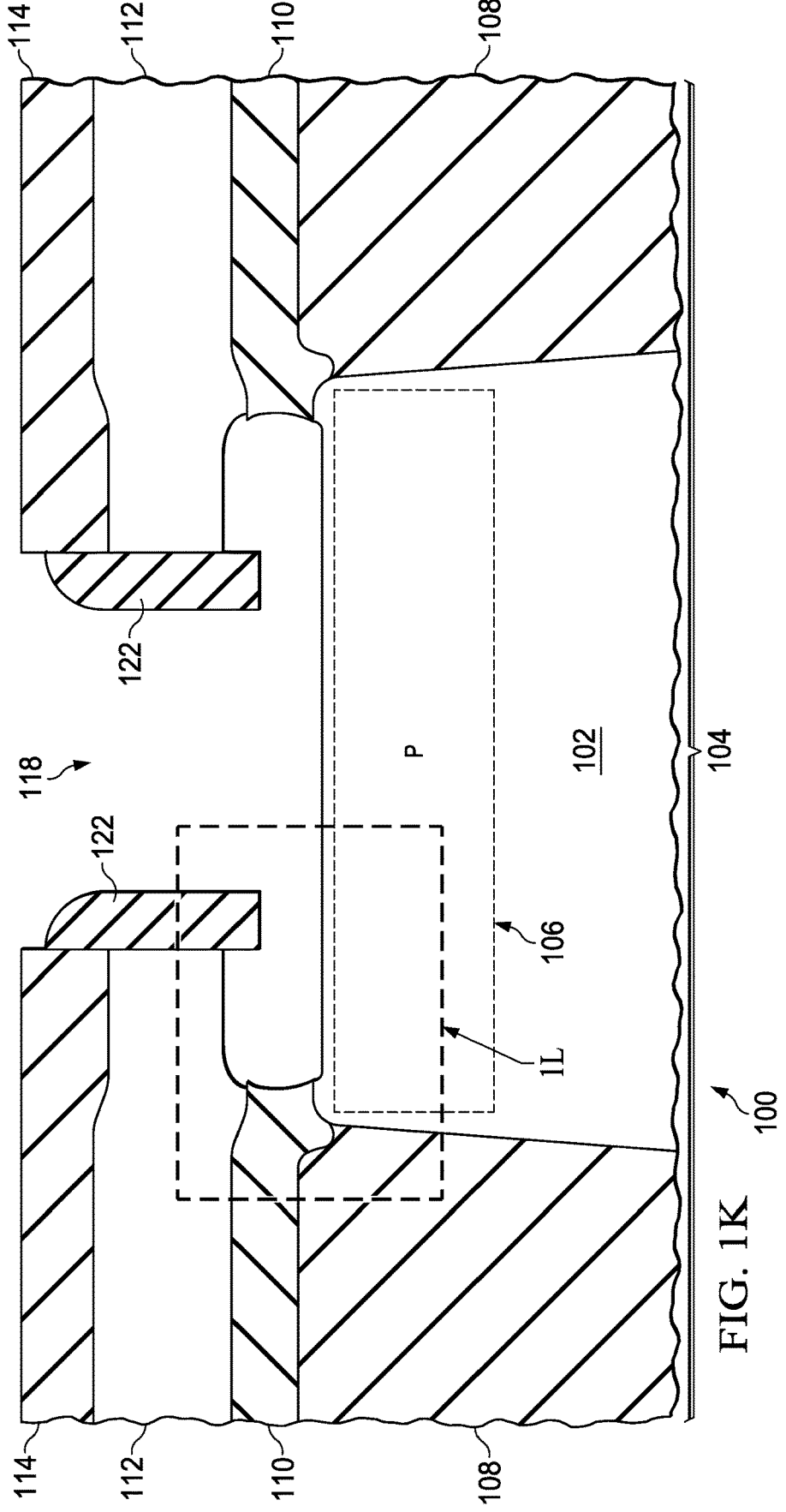
Figure 1L:
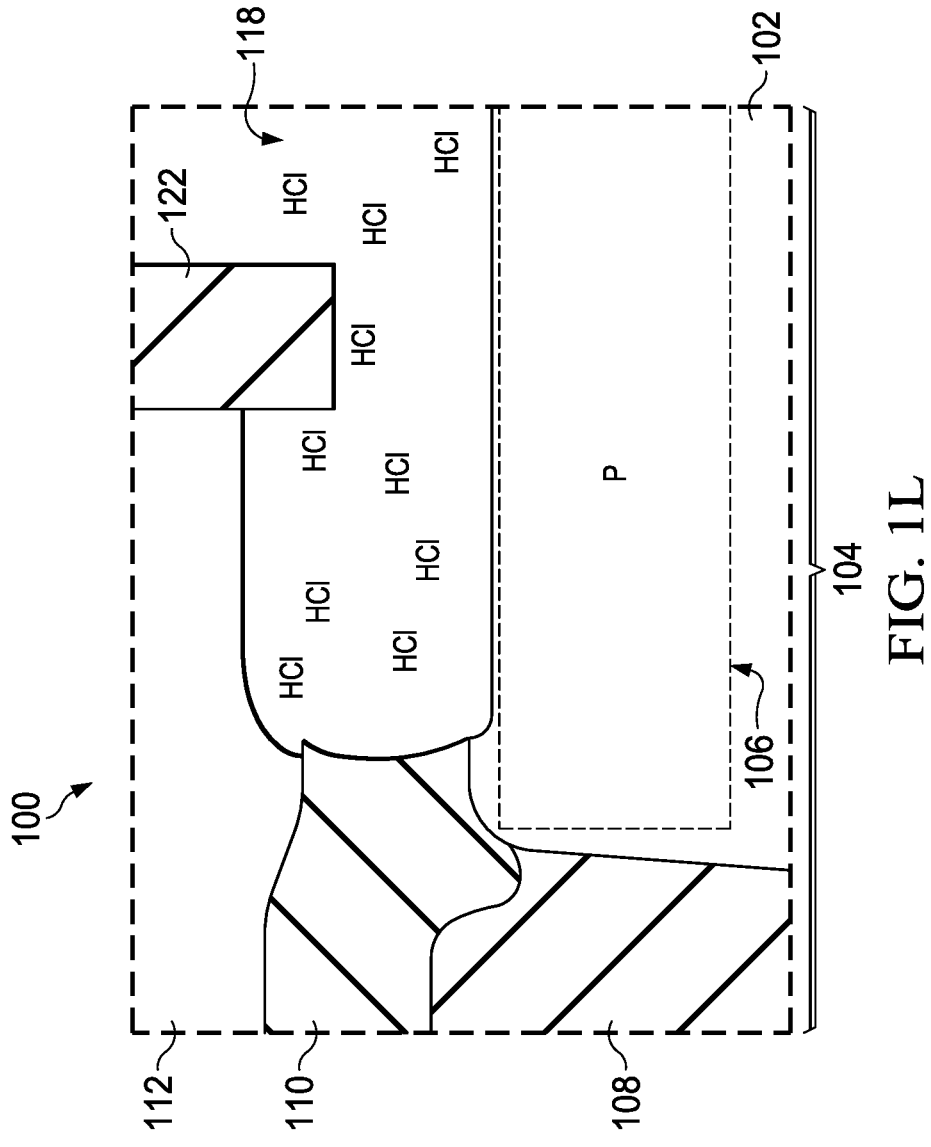
Figure 1M:
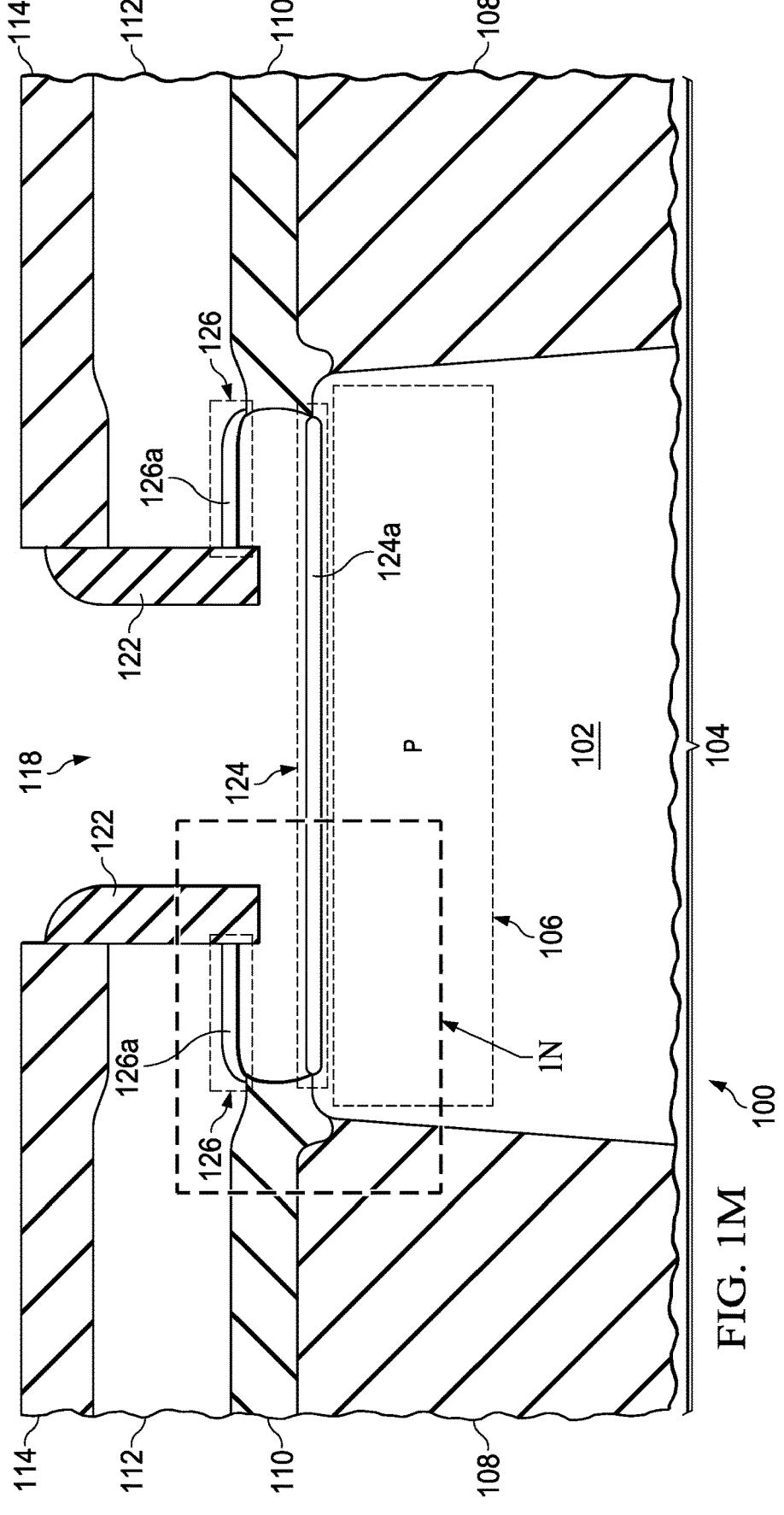
Figure 1N:
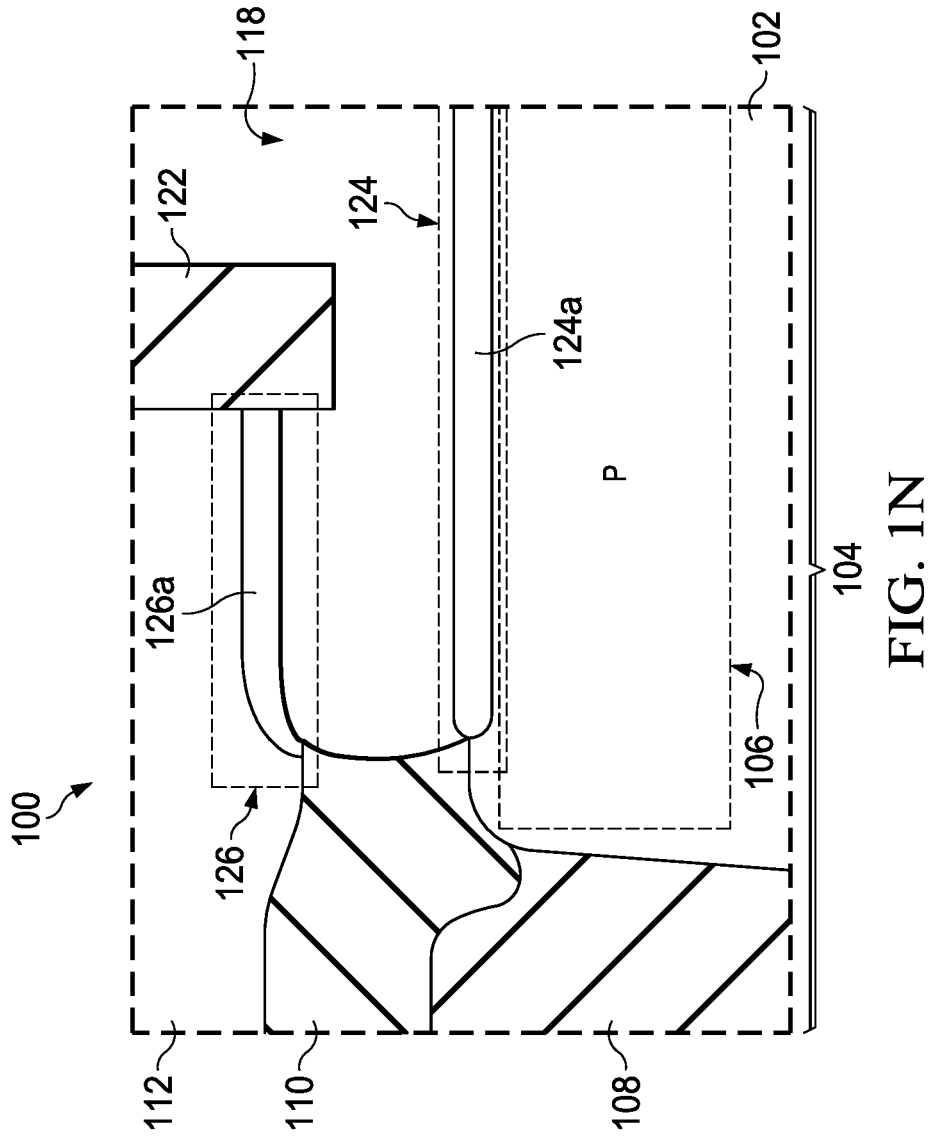
Figure 1O:
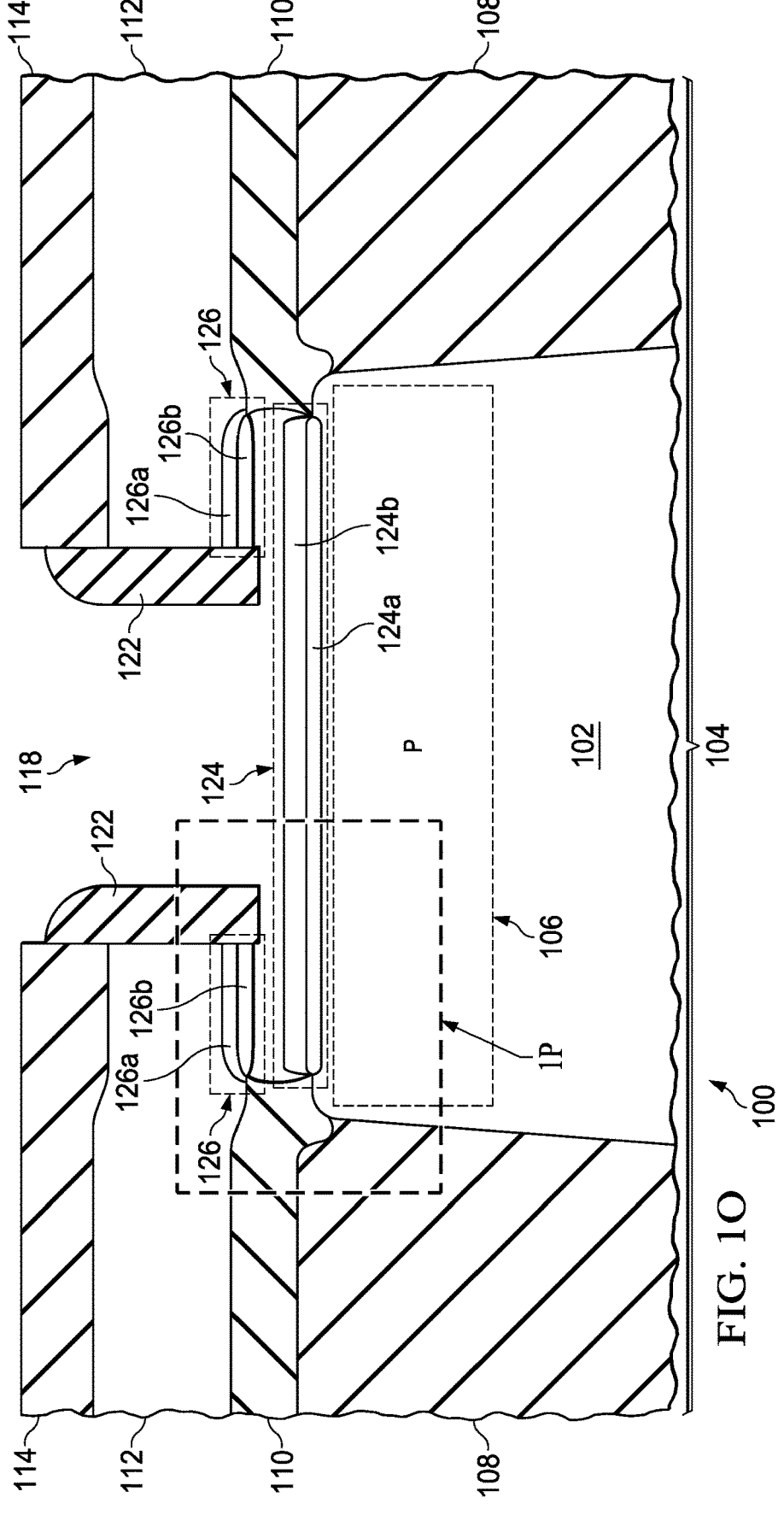
Figure 1P:
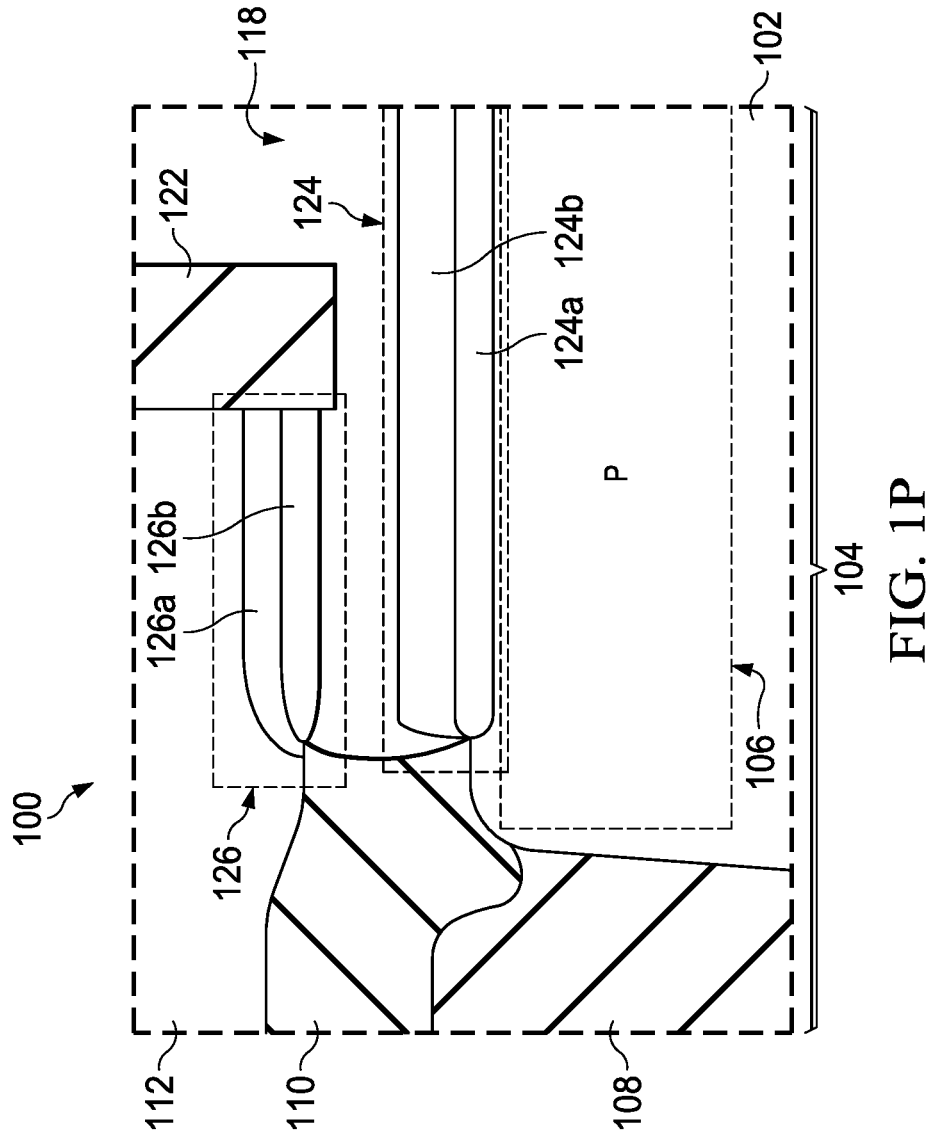
Figure 1Q:
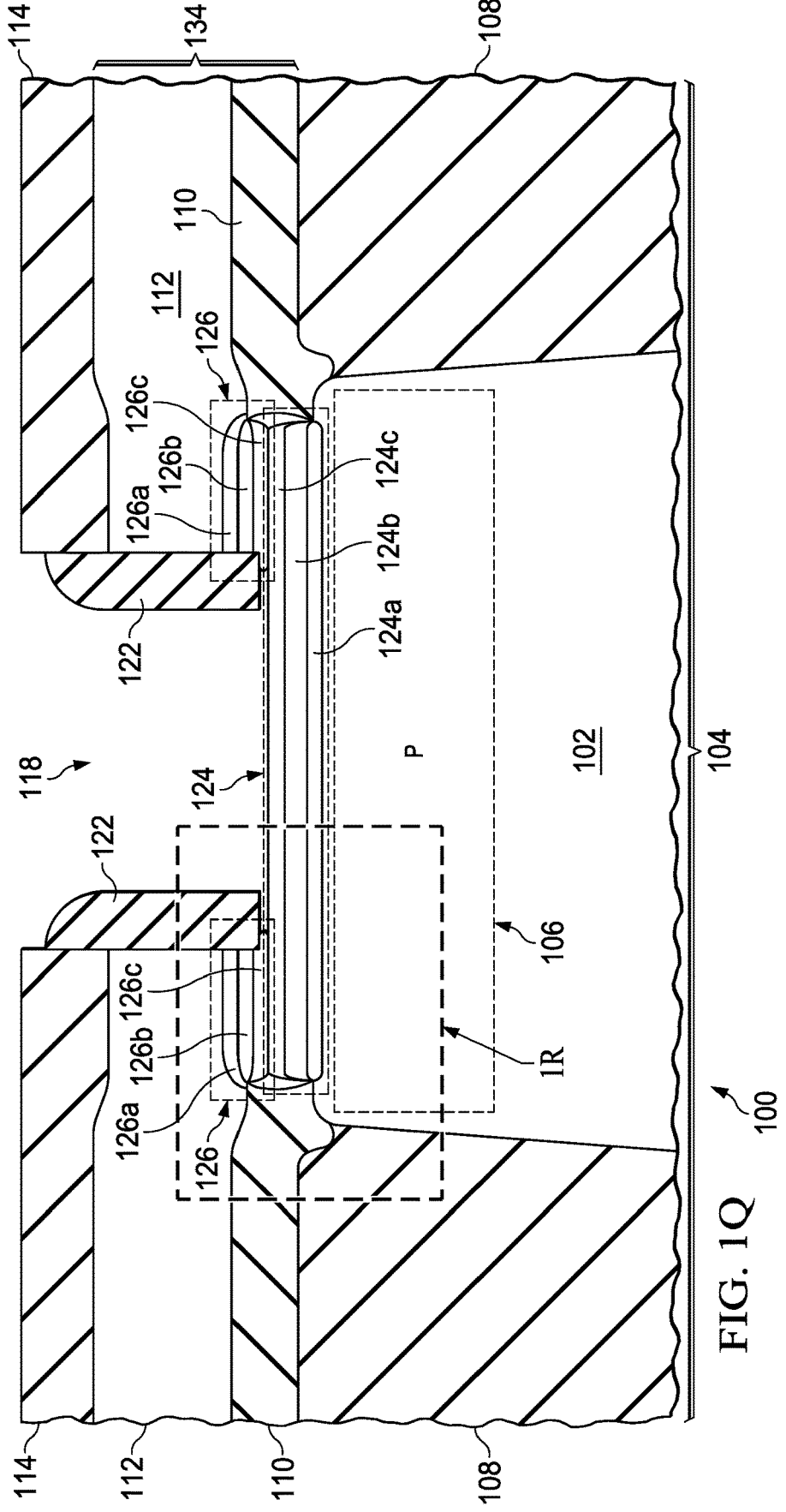
Figure 1R:
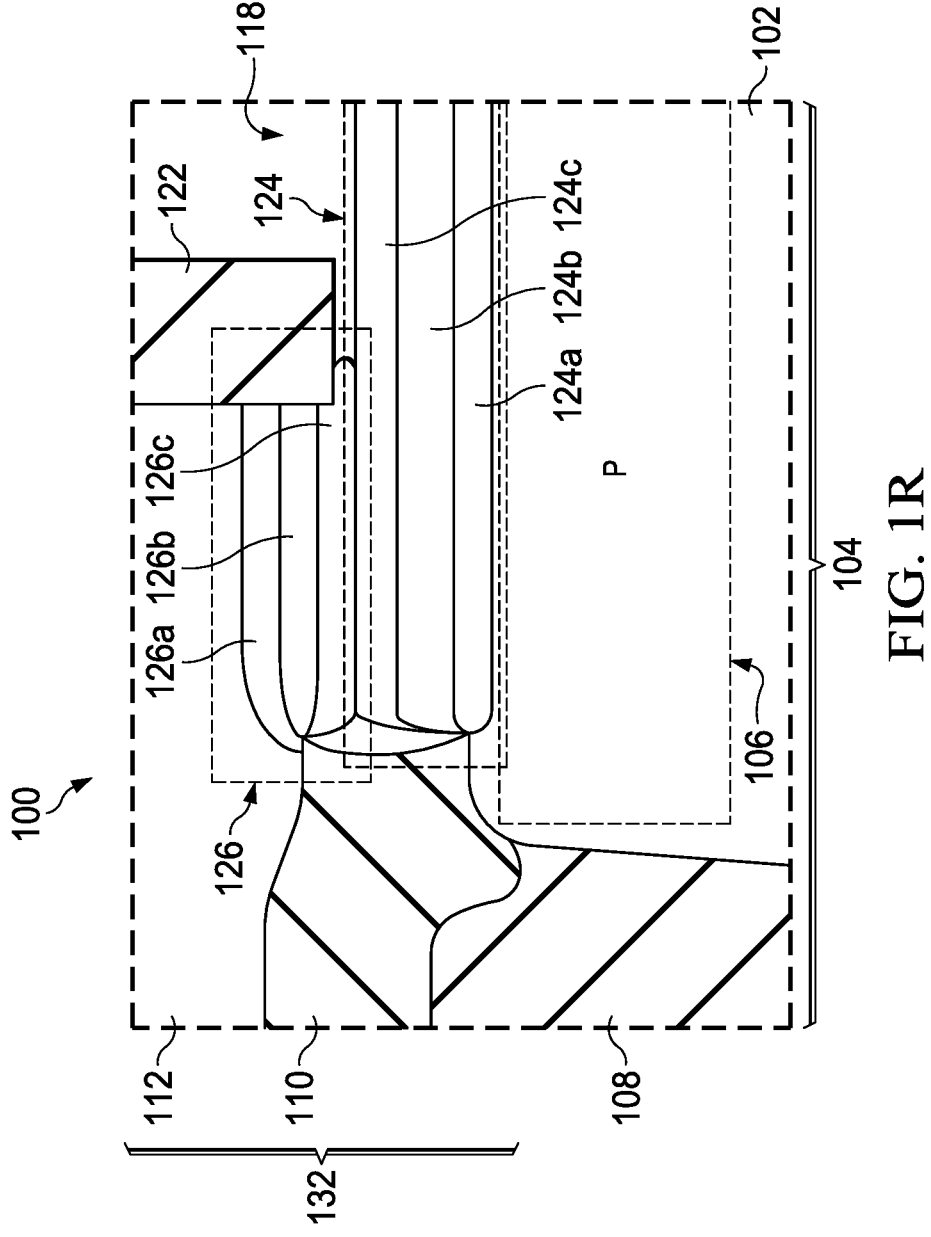
Figure 1S:
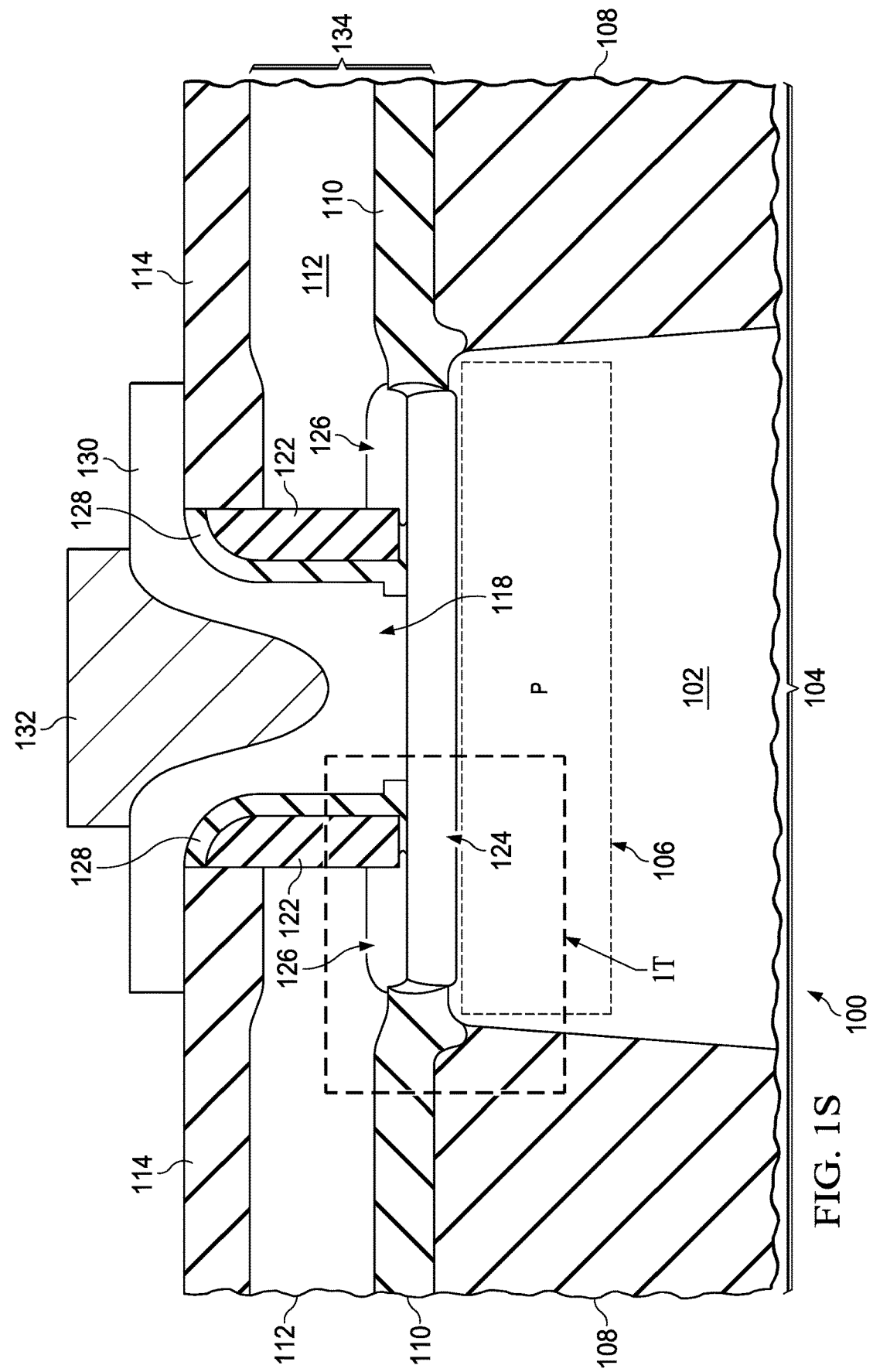
Figure 1T:
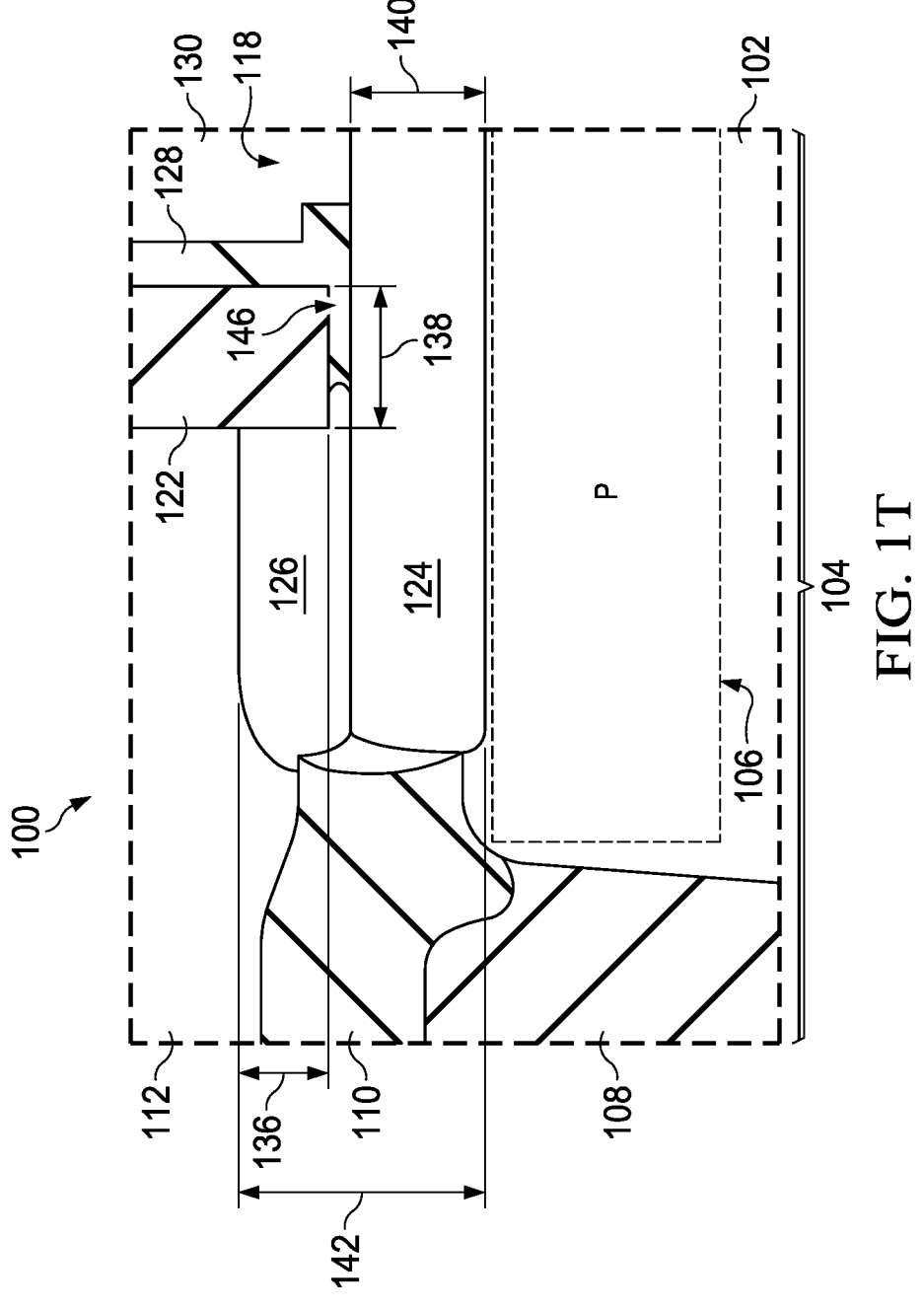

FIG. 1A through FIG. 1T are cross-sections of an example semiconductor device having an HBT, depicted in stages of an example method of formation. Referring to FIG. 1A and FIG. 1B, which is an enlarged view of a portion of FIG. 1A, the semiconductor device 100 includes a substrate 102 of monocrystalline silicon. The substrate 102 may be implemented as a silicon wafer or a silicon on insulator (SOI) wafer, by way of example. The HBT 104 is described in this example as a PNP HBT. An NPN version of the HBT 104 may be formed by appropriate changes in conductivity types and dopant species.

The HBT 104 includes a collector 106 in the substrate 102. The collector 106 has a first conductivity type; in this example, the first conductivity type is p-type. The collector 106 may be laterally isolated by field oxide 108. The field oxide 108 may be formed by a shallow trench isolation (STI) process, characterized by silicon dioxide in a trench in the substrate 102, as indicated in FIG. 1A and FIG. 1B. Alternatively, the field oxide 108 may be formed by a local oxidation of silicon (LOCOS) process, characterized by a tapered edge, commonly referred to as a bird's beak.

A base spacer layer 110 is formed over the collector 106, and may extend over the field oxide 108 adjacent to the collector 106. The base spacer layer 110 may include primarily silicon dioxide, formed by a plasma enhanced chemical vapor deposition (PECVD) process using tetraethyl orthosilicate (TEOS), formally named tetraethoxysilane. Alternatively, the base spacer layer 110 may include primarily silicon nitride, formed by a low pressure chemical vapor deposition (LPCVD) process using dichlorosilane ($SiCl_2H_2$) and ammonia, by an LPCVD process using bis (tertiary-butyl-amino)silane (BTBAS) and ammonia, or by a PECVD process using BTBAS and ammonia, by way of example. Other compositions for the base spacer layer 110 and process for forming the base spacer layer 110 are within the scope of this example. The base spacer layer 110 is thicker than a monocrystalline base layer, not shown in FIG. 1A and FIG. 1B, formed in a later step and shown in FIG. 1Q and FIG. 1R.

An extrinsic base layer 112 is formed over the base spacer layer 110. The extrinsic base layer 112 includes polycrystalline silicon, referred to herein as polysilicon. The extrinsic base layer 112 has a second conductivity type, opposite from the first conductivity type. In this example, the second conductivity type is n-type.

A base-emitter separation dielectric layer 114 may be formed over the extrinsic base layer 112. The base-emitter separation dielectric layer 114 is electrically non-conductive, and may include silicon nitride, and may formed by an LPCVD process or by a PECVD. Alternatively, the base-emitter separation dielectric layer 114 may include silicon dioxide, and may be formed by a PECVD process using TEOS or a high aspect ratio process (HARP) using TEOS and ozone, by way of example.

Referring to FIG. 1C and FIG. 1D, which is an enlarged view of a portion of FIG. 1C, an emitter window etch mask 116 is formed over the 114. An opening in the emitter window etch mask 116 exposes the base-emitter separation dielectric layer 114 in an area for an emitter window 118. The emitter window etch mask 116 may include photoresist, and may be formed by a photolithographic process. The emitter window etch mask 116 may also include anti-reflective material, such as a bottom anti-reflection coat (BARC). The emitter window etch mask 116 may further include hard mask material, such as silicon nitride or amorphous carbon.

The base-emitter separation dielectric layer 114 and the extrinsic base layer 112 are removed from the emitter window 118, where exposed by the opening in the emitter window etch mask 116. The base-emitter separation dielectric layer 114 and the extrinsic base layer 112 may be removed by sequential reactive ion etch (RIE) processes or inductively coupled plasma (ICP) processes. The base-emitter separation dielectric layer 114 may be removed using fluorine radicals and argon ions to provide chemical and physical etching, respectively. Removal of the base-emitter separation dielectric layer 114 may also use hydrocarbons to provide sidewall passivation on the base-emitter separation dielectric layer 114 in the emitter window 118 to reduce lateral etching. The extrinsic base layer 112 may be removed using chlorine and/or bromine radicals, to provide etch selectivity of the underlying base spacer layer 110. A small amount of the base spacer layer 110 may be removed in an overetch phase, as depicted in FIG. 1C and FIG. 1D, to provide complete etching across the substrate 102.

After the base-emitter separation dielectric layer 114 and the extrinsic base layer 112 are removed from the emitter window 118, the emitter window etch mask 116 is removed. Organic material in the emitter window etch mask 116, such as photoresist and BARC, may be removed by oxygen radicals in an asher process. Inorganic material in the emitter window etch mask 116, such as silicon nitride or amorphous carbon, may be removed by an appropriate plasma etch process.

Referring to FIG. 1E and FIG. 1F, which is an enlarged view of a portion of FIG. 1E, an emitter spacer layer 120 is formed over the base-emitter separation dielectric layer 114, extending into the emitter window 118 and onto the base spacer layer 110. The emitter spacer layer 120 is continuous and at least partially conformal, covering sidewalls of the extrinsic base layer 112 in the emitter window 118. In versions of this example in which the base spacer layer 110 includes primarily silicon dioxide, the emitter spacer layer 120 may include primarily silicon nitride, with 5 atomic percent to 15 atomic percent hydrogen, formed by an LPCVD process using dichlorosilane and ammonia, by an LPCVD process using BTBAS and ammonia, or by a PECVD using BTBAS and ammonia, by way of example. In versions of this example in which the base spacer layer 110 includes primarily silicon nitride, the emitter spacer layer 120 may include primarily silicon dioxide, formed by an LPCVD process or a PECVD process. The emitter spacer layer 120 on the sidewalls of the extrinsic base layer 112 in the emitter window 118 may have a lateral thickness of 25 percent to 100 percent of a vertical thickness of the monocrystalline base layer, referred to herein as the monocrystalline base thickness 140, shown in FIG. 1S and FIG. 1T, by way of example.

Referring to FIG. 1G and FIG. 1H, which is an enlarged view of a portion of FIG. 1G, an anisotropic etch process is used to remove the emitter spacer layer 120 over the base spacer layer 110 in a central area of the emitter window 118, leaving the emitter spacer layer 120 on the sidewalls of the extrinsic base layer 112 in the emitter window 118 to provide an emitter spacer 122 that extends to the base spacer layer 110. The anisotropic etch process may also remove the emitter spacer layer 120 from over the base-emitter separation dielectric layer 114, as depicted in FIG. 1G and FIG. 1H. The anisotropic etch process may be implemented as an RIE process using fluorine radicals and hydrogen. The anisotropic etch process may remove a small amount of the base spacer layer 110 to ensure complete removal of the emitter spacer layer 120 in the central area of the emitter window 118.

Referring to FIG. 1I and FIG. 1J, which is an enlarged view of a portion of FIG. 1I, a portion of the base spacer layer 110 is removed, exposing the collector 106 under the emitter window 118, and exposing portions of lower surfaces of the extrinsic base layer 112 adjacent to the emitter spacer 122. In versions of this example in which the base spacer layer 110 includes primarily silicon dioxide, the portion of the base spacer layer 110 may be removed by a timed wet etch process using an aqueous solution of buffered dilute hydrofluoric acid. In versions of this example in which the base spacer layer 110 includes primarily silicon nitride, the portion of the base spacer layer 110 may be removed by a timed wet etch process using an aqueous solution of phosphoric acid at 140° C. to 180° C.

Referring to FIG. 1K and FIG. 1L, which is an enlarged view of a portion of FIG. 1K, a portion of the extrinsic base layer 112 is removed at the lower surface, adjacent to the emitter spacer 122, where exposed by the removal of the portion of the base spacer layer 110. The portion of the extrinsic base layer 112 may be removed by a vapor phase etch process using a gas phase etchant that includes one or more halogen species, such as chlorine, fluorine, or bromine. The vapor phase etch process may be carried out in an epitaxial reactor used to subsequently form the monocrystalline base layer 124, shown in FIG. 1M through FIG. 1T, a downstream etcher, which produces halogen radicals, or a plasma-less vapor phase etcher, which produces hydrogen-halogen vapor such as hydrogen chloride vapor or xenon difluoride vapor, by way of example. A portion of the collector 106 may be removed by the vapor phase etch process, as depicted in FIG. 1K and FIG. 1L, concurrently with removal of the portion of the extrinsic base layer 112. A vertical thickness of the portion of the extrinsic base layer 112 that is removed may be 40 percent to 75 percent of the monocrystalline base thickness 140, shown in FIG. 1S and FIG. 1T, by way of example.

Referring to FIG. 1M and FIG. 1N, which is an enlarged view of a portion of FIG. 1M, a first base sublayer 124a of a monocrystalline base layer 124 is formed over the collector 106, and a first base link sublayer 126a of a base link 126 is concurrently formed on the extrinsic base layer 112 at the lower surface, adjacent to the emitter spacer 122. The first base sublayer 124a and the first base link sublayer 126a may be formed by a first vapor phase epitaxial process using silicon-containing and/or germanium-containing gas reagents, such as dichlorosilane and germane (GeH₄). The first base sublayer 124a is monocrystalline, has the second conductivity type, in this example, p-type, and includes silicon or silicon-germanium. The first base link sublayer 126a is polycrystalline, and has a composition similar to the first base sublayer 124a, as a result of being formed concurrently with the first base sublayer 124a. The first base sublayer 124a grows upward from the collector 106, while the first base link sublayer 126a grows downward from the lower surface of the extrinsic base layer 112 at approximately the same rate as the first base sublayer 124a. The monocrystalline base layer 124 extends laterally past the emitter spacer 122, under the extrinsic base layer 112.

Referring to FIG. 1O and FIG. 1P, which is an enlarged view of a portion of FIG. 1O, a second base sublayer 124b of the monocrystalline base layer 124 is formed over the first base sublayer 124a, and a second base link sublayer 126b of the base link 126 is concurrently formed on the first base link sublayer 126a, adjacent to the emitter spacer 122. The second base sublayer 124b and the second base link sublayer 126b may be formed by a second vapor phase epitaxial process. The second base sublayer 124b is monocrystalline, has the second conductivity type, and includes silicon or silicon-germanium. The second base link sublayer 126b is polycrystalline, and has a composition similar to the second base sublayer 124b, as a result of being formed concurrently with the second base sublayer 124b. The second base sublayer 124b may have a different composition, dopant density, and/or thickness than the first base sublayer 124a. The second base sublayer 124b grows upward from the first base sublayer 124a, while the second base link sublayer 126b grows downward from the first base link sublayer 126a at approximately the same rate as the second base sublayer 124b.

Referring to FIG. 1Q and FIG. 1R, which is an enlarged view of a portion of FIG. 1Q, a third base sublayer 124c of the monocrystalline base layer 124 is formed over the second base sublayer 124b, and a third base link sublayer 126c of the base link 126 is concurrently formed on the second base link sublayer 126b, adjacent to the emitter spacer 122. The third base sublayer 124c and the third base link sublayer 126c may be formed by a third vapor phase epitaxial process. The third base sublayer 124c is monocrystalline, has the second conductivity type, and includes silicon or silicon-germanium. The third base link sublayer 126c is polycrystalline, and has a composition similar to the third base sublayer 124c, as a result of being formed concurrently with the third base sublayer 124c. The third base sublayer 124c may have a different composition, dopant density, and/or thickness than the first base sublayer 124a and/or the second base sublayer 124b. The third base sublayer 124c grows upward from the second base sublayer 124b, while the third base link sublayer 126c grows downward from the second base link sublayer 126b at approximately the same rate as the third base sublayer 124c.

The first base sublayer 124a, the second base sublayer 124b, and the third base sublayer 124c provide the monocrystalline base layer 124 of this example. At least one of the first base sublayer 124a, the second base sublayer 124b, and the third base sublayer 124c includes silicon-germanium. The first base link sublayer 126a, the second base link sublayer 126b, and the third base link sublayer 126c provide the base link 126 of this example. The base link 126 connects the extrinsic base layer 112 to the monocrystalline base layer 124. The monocrystalline base layer 124, the base link 126, and the extrinsic base layer 112 provide a base 134 of the HBT 104.

In other versions of this example, the monocrystalline base layer 124 may include fewer or more base sublayers. Consequently, the base link 126 would include the same number of sublayers as the monocrystalline base layer 124.

Referring to FIG. 1S and FIG. 1T, which is an enlarged view of a portion of FIG. 1S, an emitter liner 128 is formed on the monocrystalline base layer 124 and the emitter spacer 122 in the emitter window 118. The emitter liner 128 exposes the monocrystalline base layer 124 in the emitter window 118. The emitter liner 128 is electrically non-conductive. The emitter liner 128 may include two or more sublayers of a dielectric material such as silicon dioxide and silicon nitride, by way of example.

An emitter 130 is formed in the emitter window 118, on the emitter liner 128 and on the monocrystalline base layer 124 where exposed by the emitter liner 128. The emitter 130 may extend outside the emitter window 118, as depicted in FIG. 1S. The emitter 130 of this example is monocrystalline, and includes primarily silicon. The emitter 130 has the first conductivity type, in this example, n-type. The emitter 130 may be formed by a silicon vapor phase epitaxy process using silane. Metal silicide, such as cobalt silicide, not shown in FIG. 1S, may be formed on the emitter 130. An emitter contact 132 makes a conductive connection to the emitter 130. The emitter contact 132 may include tungsten, formed by a metal organic chemical vapor deposition (MOCVD) process.

FIG. 1S and FIG. 1T depict the semiconductor device 100 of FIG. 1Q and FIG. 1R, with internal sublayers of the monocrystalline base layer 124 and the base link 126 omitted, in order to show dimensional relationships of the HBT 104 more clearly. That is, the base sublayers 124a, 124b, and 124c, and the base link sublayers 126a, 126b, and 126c are not shown in FIG. 1S and FIG. 1T.

The base link 126 laterally abuts the emitter spacer 122. In this example, a bottom surface of the extrinsic base layer 112, in contact with the base link 126, is recessed. The HBT 104 has a spacer-extrinsic base vertical offset 136, which is a vertical distance between the bottom of the emitter spacer 122 and the bottom surface of the extrinsic base layer 112 adjacent to the emitter spacer 122. The emitter spacer 122 has a bottom width 138, which is a width of the emitter spacer 122 at the bottom of the emitter spacer 122, closest to the monocrystalline base layer 124. The monocrystalline base layer 124 has the monocrystalline base thickness 140, which is a thickness of the monocrystalline base layer 124 in the vertical direction. The spacer-extrinsic base vertical offset 136 of this example may be 50 percent to 75 percent of the monocrystalline base thickness 140, by way of example. The bottom width 138 of the emitter spacer 122 of this example may be 25 percent to 100 percent of the monocrystalline base thickness 140, by way of example. A sum of the spacer-extrinsic base vertical offset 136 and the bottom width 138 is greater than the monocrystalline base thickness 140. This characteristic may prevent polycrystalline material of the base link 126 from growing past the emitter spacer 122 into the emitter window 118, advantageously providing a consistent contact area between the emitter 130 and the monocrystalline base layer 124 and enabling a reduced area for the HBT 104, compared to an HBT with polycrystalline material protruding into the emitter window.

The base link 126 grows downward at approximately the same rate as the monocrystalline base layer 124 grows upward. A base link cavity height 142, which is a vertical distance between the collector 106 and the extrinsic base layer 112 adjacent to the emitter spacer 122, may be less than twice the monocrystalline base thickness 140, enabling complete contact between the base link 126 and the monocrystalline base layer 124. Complete contact between the base link 126 and the monocrystalline base layer 124 may advantageously provide a low resistance connection through the base link 126 between the extrinsic base layer 112 and the monocrystalline base layer 124. There may be a gap 146 between the bottom of the emitter spacer 122 and the instant top surface of the monocrystalline base layer 124 as the monocrystalline base layer 124 is grown, enabling access of epitaxy reagent gases, such as silane and germane, to the base link 126 as it is growing, further advantageously providing complete contact between the base link 126 and the monocrystalline base layer 124. In the completed semiconductor device 100, a vertical distance between the collector 106 and the bottom of the emitter spacer 122 may be greater than the monocrystalline base thickness 140 of the monocrystalline base layer 124.

Figure 2A:
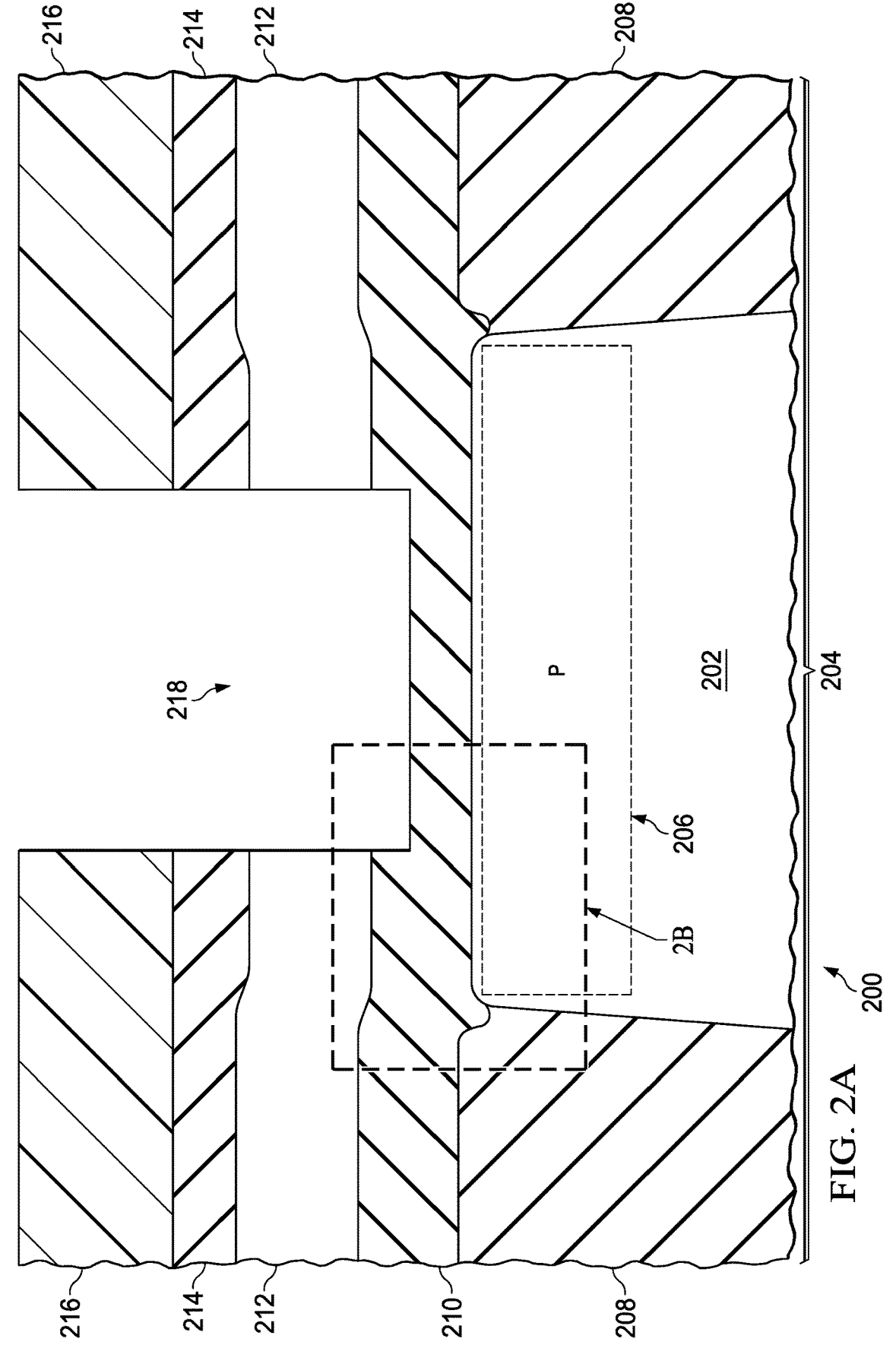
FIG. 2A through FIG. 2L are cross-sections of another example semiconductor device having an HBT, depicted in stages of another example method of formation.
Figure 2B:
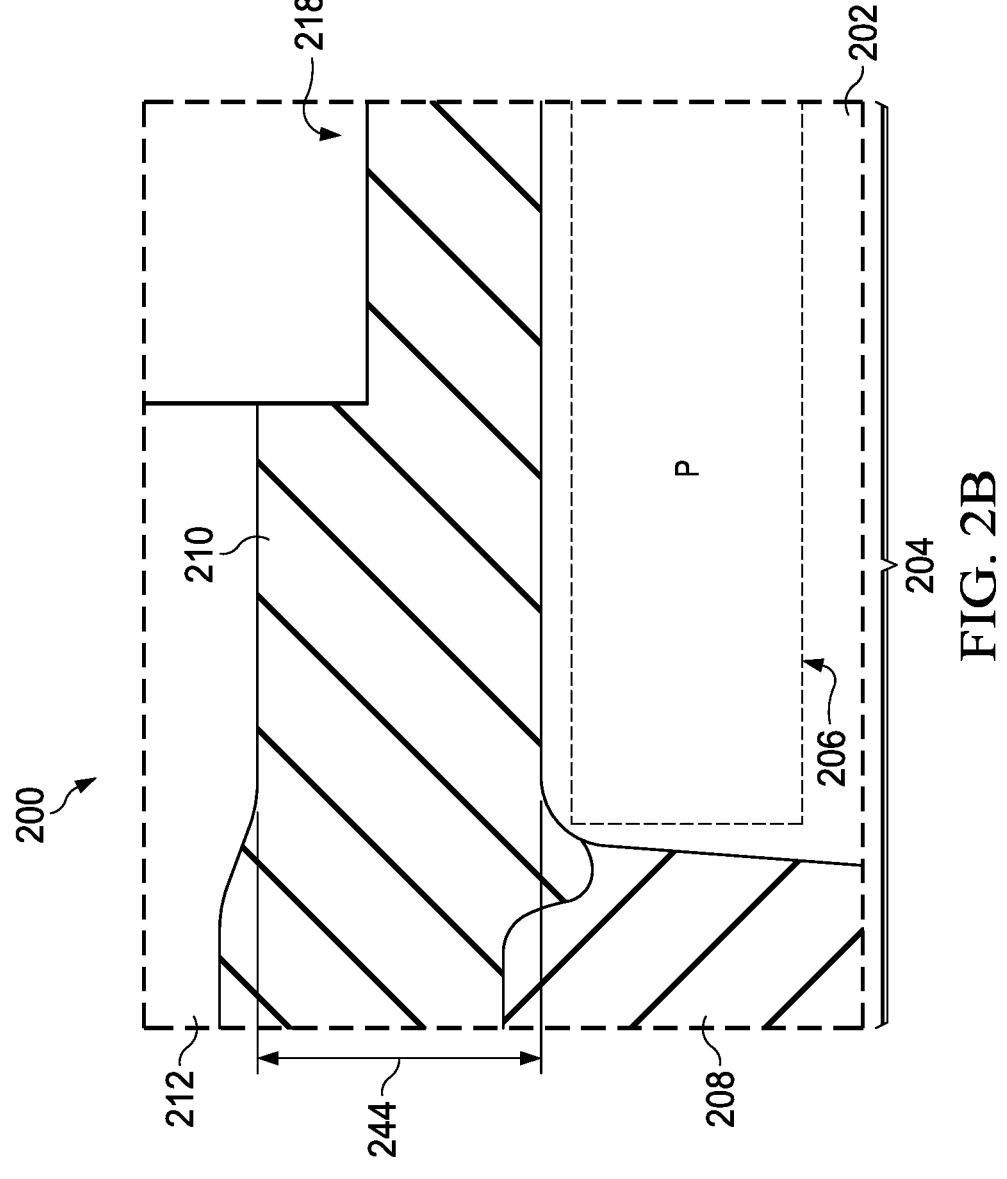

FIG. 2A through FIG. 2L are cross-sections of another example semiconductor device having an HBT, depicted in stages of another example method of formation. Referring to FIG. 2A and FIG. 2B, which is an enlarged view of a portion of FIG. 2A, the semiconductor device 200 includes a substrate 202 of monocrystalline silicon. The HBT 204 in this example is described as a PNP HBT. An NPN version of the HBT 204 may be formed by appropriate changes in conductivity types and dopant species. The HBT 204 includes a collector 206 having a first conductivity type, in the substrate 202. In this example, the first conductivity type is p-type. The collector 206 may be laterally isolated by field oxide 208.

A base spacer layer 210 is formed over the collector 206. The base spacer layer 210 may include primarily silicon dioxide. The base spacer layer 210 of this example may have a spacer thickness 244 that is, for example, 150 percent to 175 percent of a monocrystalline base thickness 240 of a monocrystalline base layer 224, not shown in FIG. 2A and FIG. 2B, formed in a later step and shown in FIG. 2I and FIG. 2J. An extrinsic base layer 212 is formed over the base spacer layer 210. The extrinsic base layer 212 includes polysilicon having a second conductivity type, opposite from the first conductivity type. In this example, the second conductivity type is n-type. A base-emitter separation dielectric layer 214 may be formed over the extrinsic base layer 212. The base-emitter separation dielectric layer 214 is electrically non-conductive.

An emitter window etch mask 216 is formed over the base-emitter separation dielectric layer 214, and has an opening exposing the base-emitter separation dielectric layer 214 in an area for an emitter window 218. The base-emitter separation dielectric layer 214 and the extrinsic base layer 212 are removed from the emitter window 218, where exposed by the opening in the emitter window etch mask 216. After the extrinsic base layer 212 is removed from the emitter window 218, a portion of the base spacer layer 210, is removed from the emitter window 218. The base-emitter separation dielectric layer 214, the extrinsic base layer 212, and the portion of the base spacer layer 210 may be removed by sequential RIE processes or ICP processes. A vertical depth of the portion of the base spacer layer 210 that is removed may be 40 percent to 75 percent of the monocrystalline base thickness 240 of the monocrystalline base layer 224, by way of example. After the base-emitter separation dielectric layer 214 and the extrinsic base layer 212 are removed from the emitter window 218, the emitter window etch mask 216 is removed.

Figure 2C:
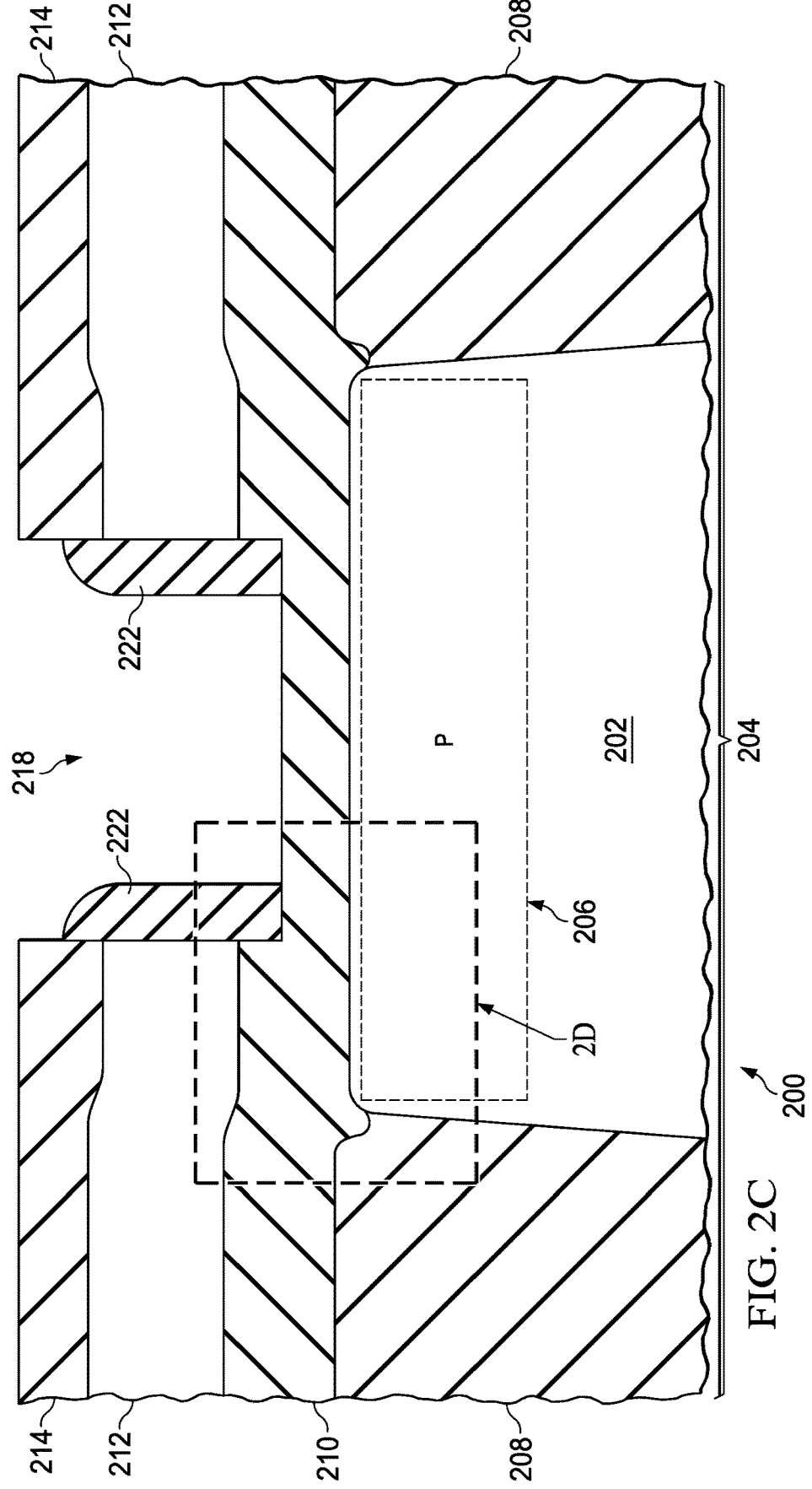
Figure 2D:
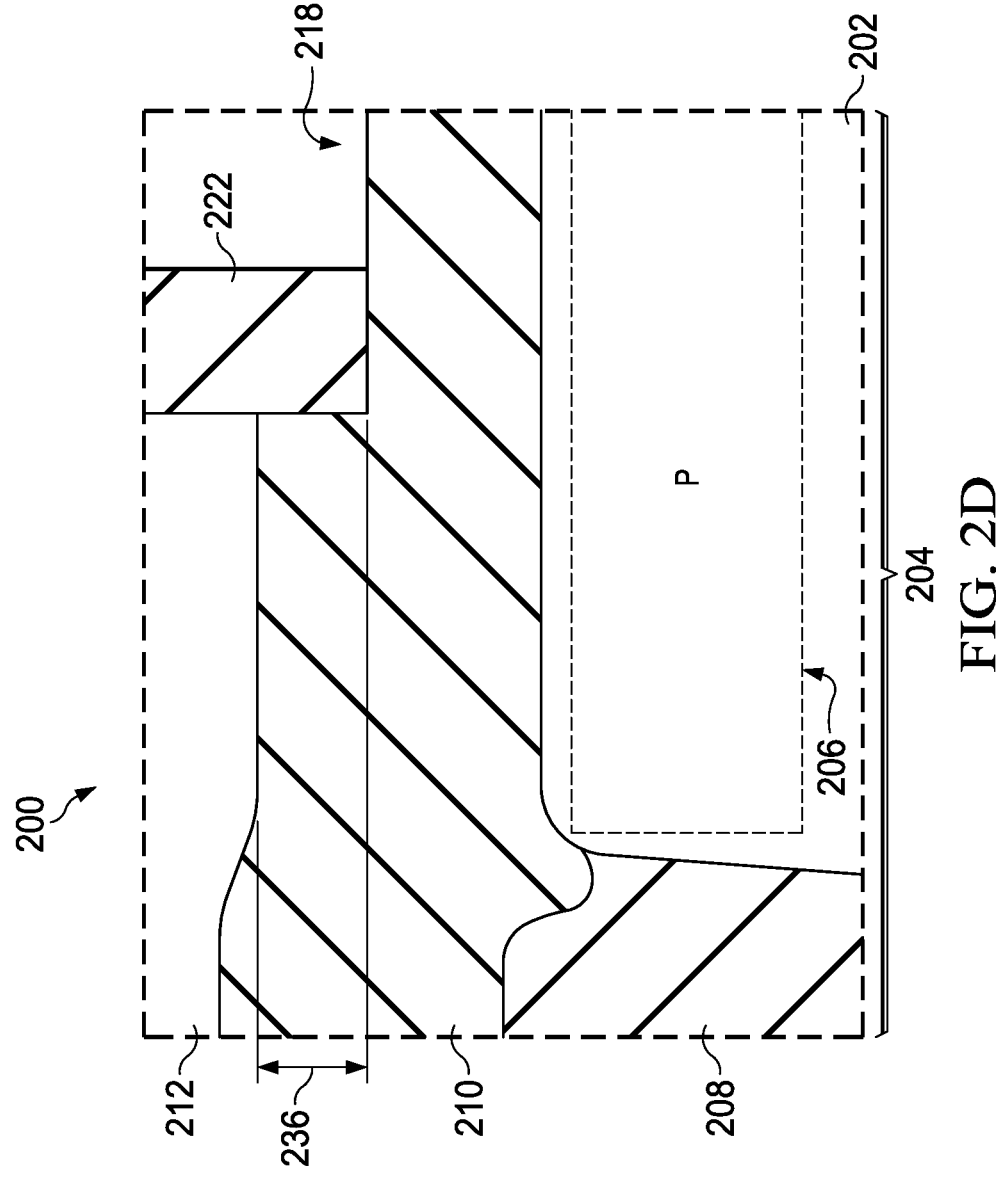

Referring to FIG. 2C and FIG. 2D, which is an enlarged view of a portion of FIG. 2C, an emitter spacer 222 is formed on sidewalls of the extrinsic base layer 212 in the emitter window 218. The emitter spacer 222 may be formed as disclosed in reference to the emitter spacer 122 of FIG. 1E through FIG. 1H. The emitter spacer 222 extends vertically past a bottom surface of the extrinsic base layer 212 adjacent to the emitter spacer 222 by a spacer-extrinsic base vertical offset 236. In this example, the spacer-extrinsic base vertical offset 236 may be 50 percent to 75 percent of the monocrystalline base thickness 240 of FIG. 2I and FIG. 2J, by way of example.

Figure 2E:
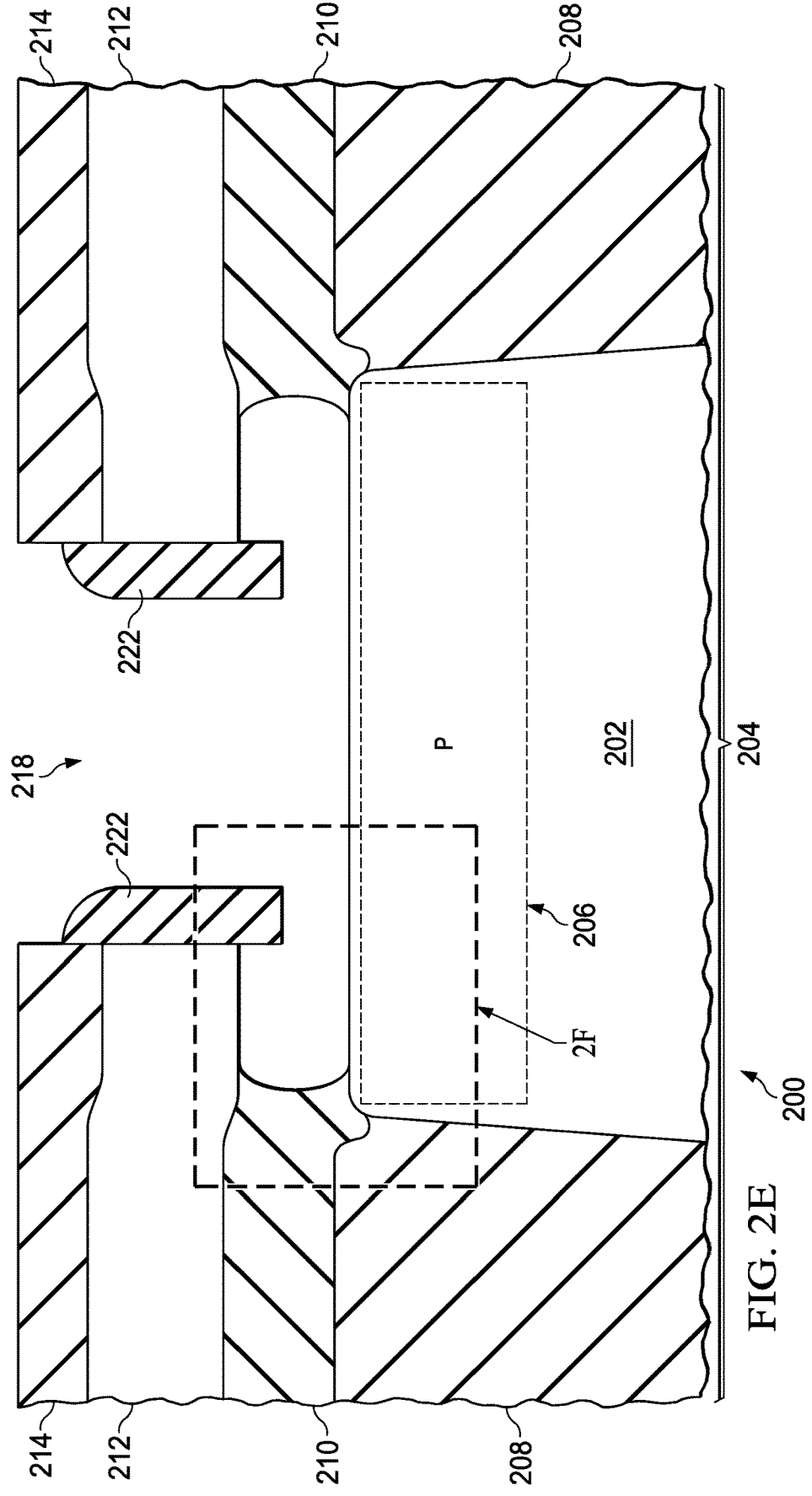
Figure 2F:
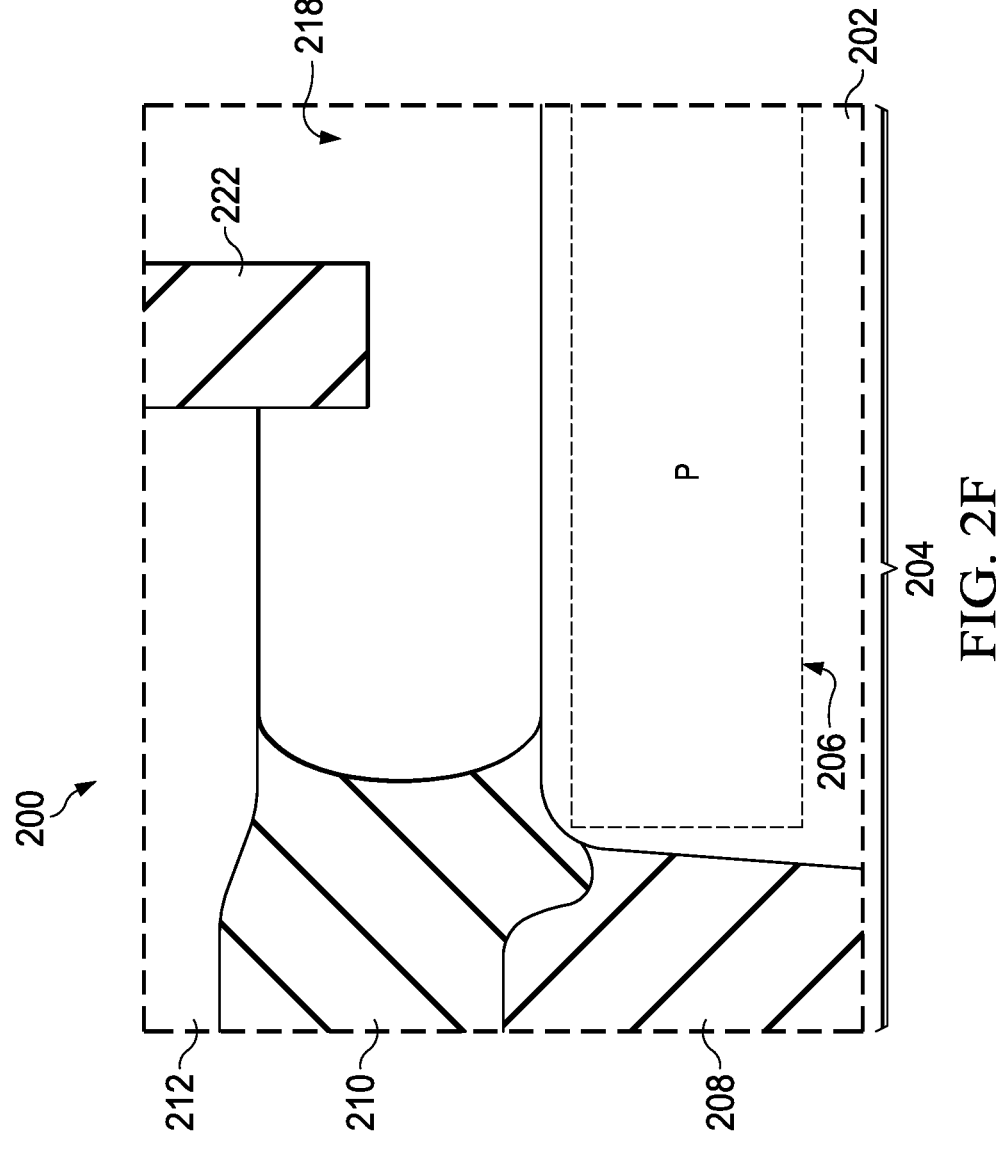

Referring to FIG. 2E and FIG. 2F, which is an enlarged view of a portion of FIG. 2E, a portion of the base spacer layer 210 is removed, exposing the collector 206, and exposing portions of the lower surfaces of the extrinsic base layer 212 adjacent to the emitter spacer 222. The portion of the base spacer layer 210 may be removed as disclosed in reference to FIG. 1I and FIG. 1J.

Figure 2G:
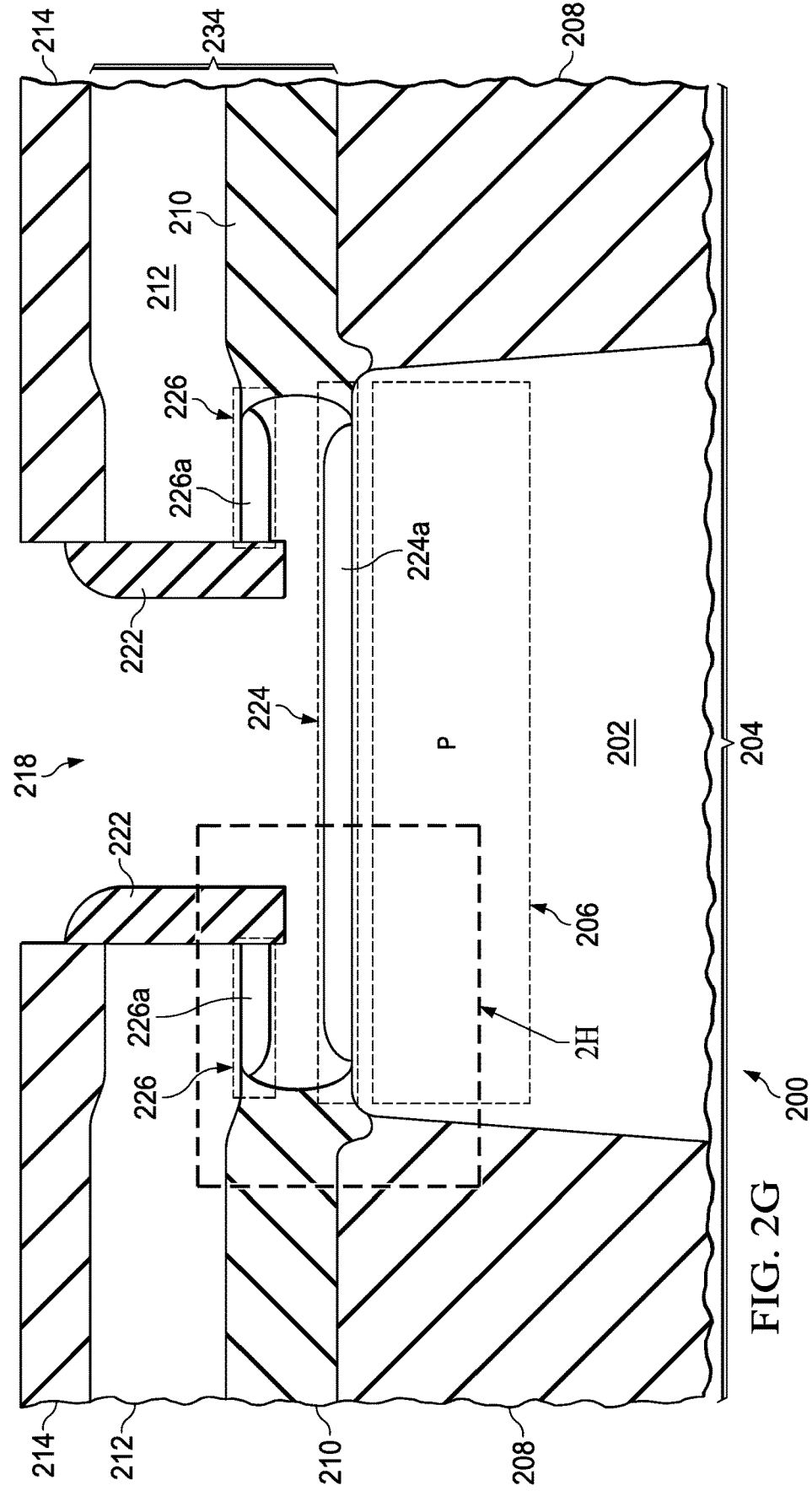
Figure 2H:
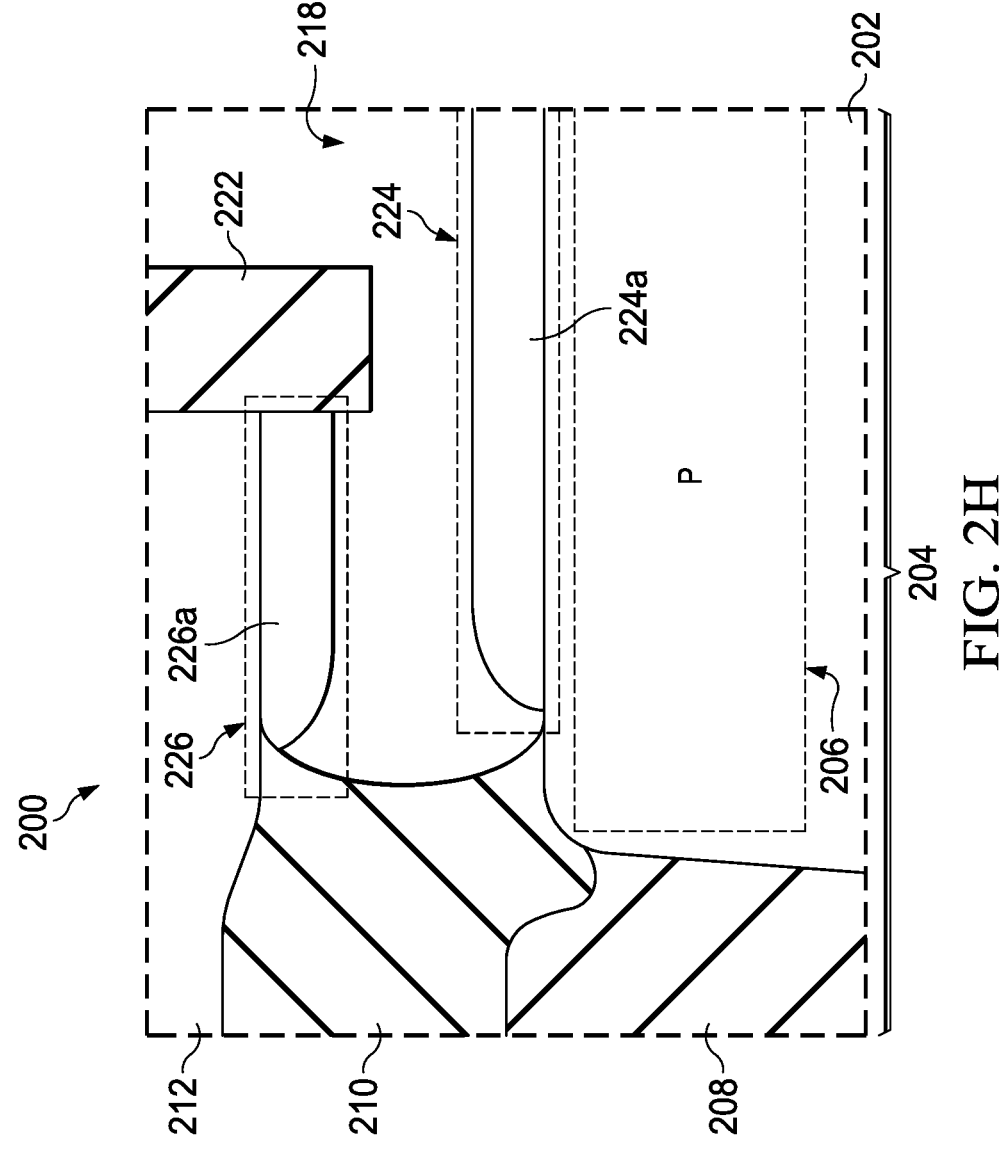

Referring to FIG. 2G and FIG. 2H, which is an enlarged view of a portion of FIG. 2G, a first base sublayer 224a of a monocrystalline base layer 224 is formed over the collector 206, and a first base link sublayer 226a of a base link 226 is concurrently formed on the extrinsic base layer 212 at the lower surface, adjacent to the emitter spacer 222. The first base sublayer 224a and the first base link sublayer 226a may be formed by a first vapor phase epitaxial process. The first base sublayer 224a is monocrystalline, has the second conductivity type, in this example, p-type, and includes silicon or silicon-germanium. The first base link sublayer 226a is polycrystalline, and has a composition similar to the first base sublayer 224a, as a result of being formed concurrently with the first base sublayer 224a. The first base sublayer 224a grows upward from the collector 206, while the first base link sublayer 226a grows downward from the lower surface of the extrinsic base layer 212 at approximately the same rate as the first base sublayer 224a. The monocrystalline base layer 224 extends laterally past the emitter spacer 222, under the extrinsic base layer 212.

Figure 2I:
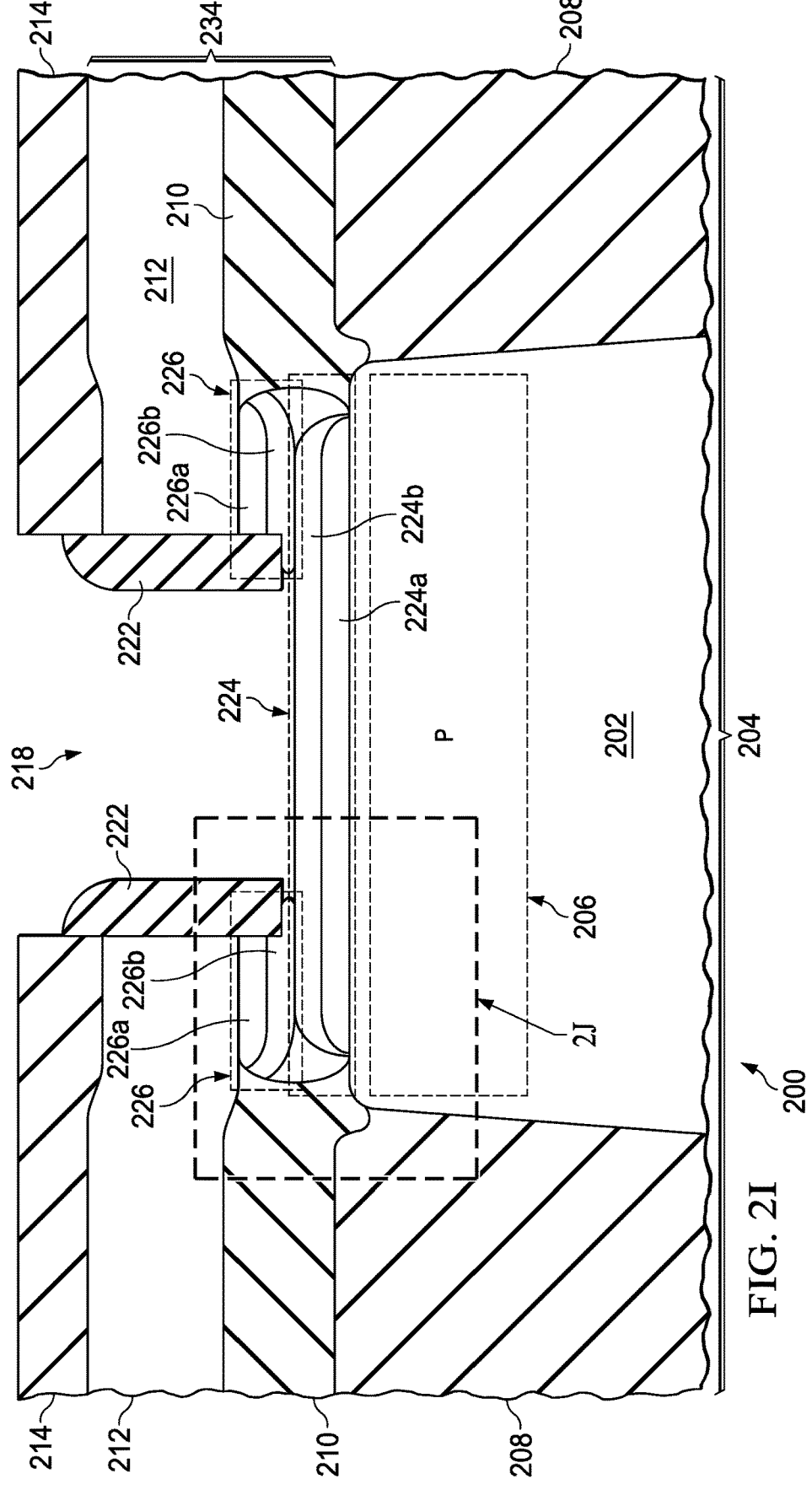
Figure 2J:
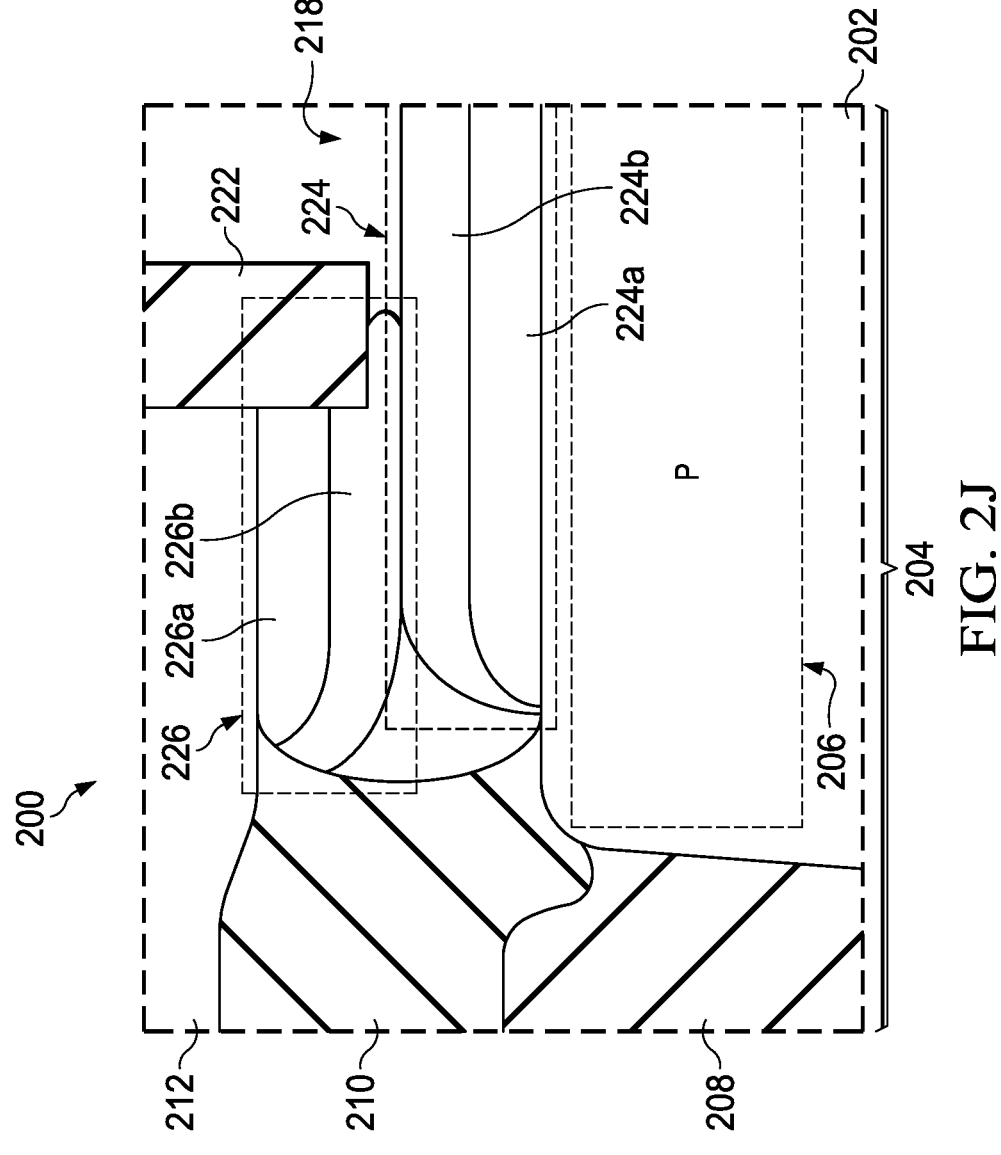

Referring to FIG. 2I and FIG. 2J, which is an enlarged view of a portion of FIG. 2I, a second base sublayer 224b of the monocrystalline base layer 224 is formed over the first base sublayer 224a, and a second base link sublayer 226b of the base link 226 is concurrently formed on the first base link sublayer 226a, adjacent to the emitter spacer 222. The second base sublayer 224b and the second base link sublayer 226b may be formed by a second vapor phase epitaxial process. The second base sublayer 224b is monocrystalline, has the second conductivity type, and includes silicon or silicon-germanium. The second base link sublayer 226b is polycrystalline, and has a composition similar to the second base sublayer 224b, as a result of being formed concurrently with the second base sublayer 224b. The second base sublayer 224b may have a different composition, dopant density, and/or thickness than the first base sublayer 224a. The second base sublayer 224b grows upward from the first base sublayer 224a, while the second base link sublayer 226b grows downward from the first base link sublayer 226a at approximately the same rate as the second base sublayer 224b.

The first base sublayer 224a and the second base sublayer 224b provide the monocrystalline base layer 224 of this example. At least one of the first base sublayer 224a and the second base sublayer 224b includes silicon-germanium. The first base link sublayer 226a and the second base link sublayer 226b provide the base link 226 of this example. The base link 226 connects the extrinsic base layer 212 to the monocrystalline base layer 224. The monocrystalline base layer 224, the base link 226, and the extrinsic base layer 212 provide a base 234 of the HBT 204.

In other versions of this example, the monocrystalline base layer 224 and the base link 226 may include fewer or more base sublayers. The base link 226 would include the same number of sublayers as the monocrystalline base layer 224.

Figure 2K:
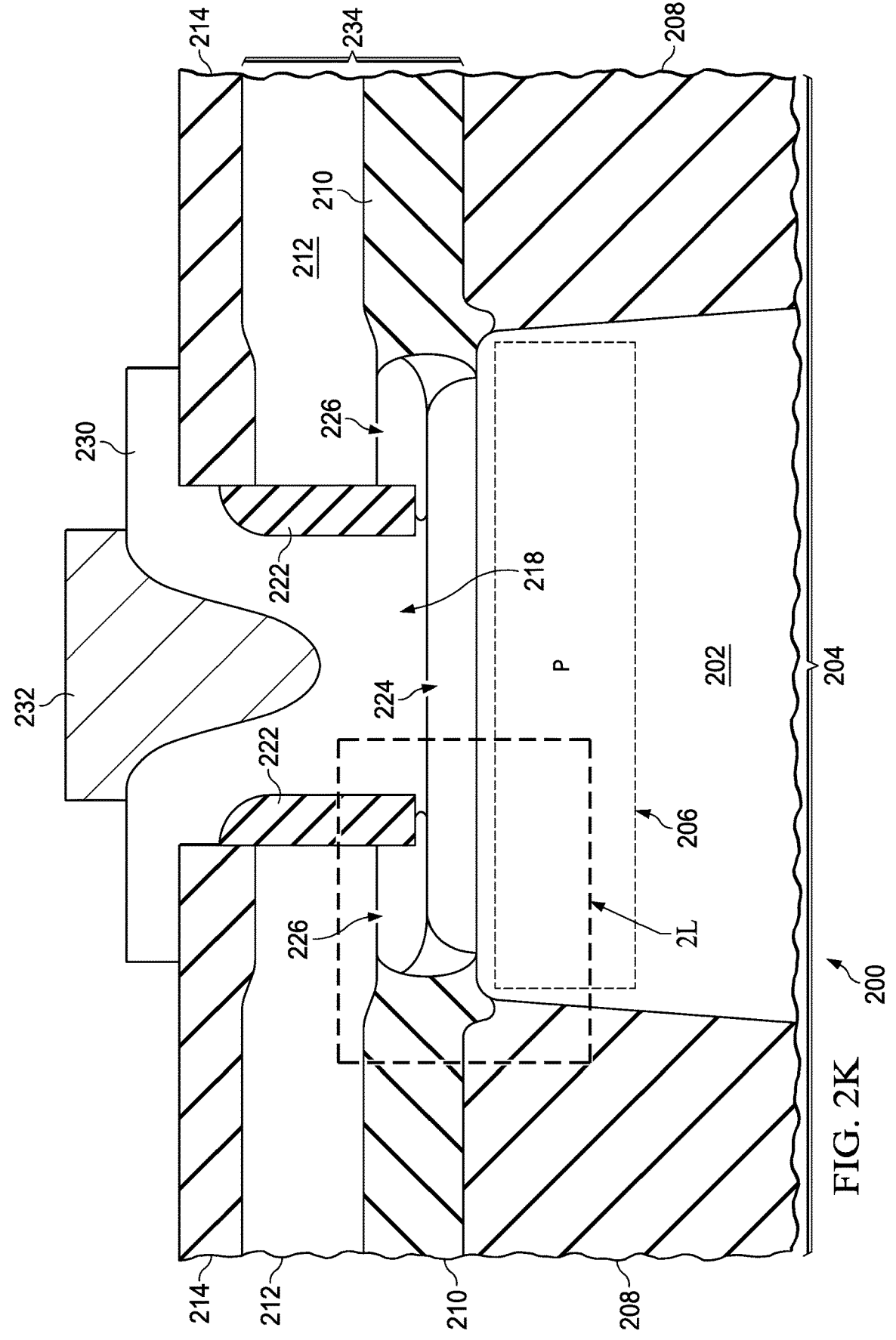
Figure 2L:
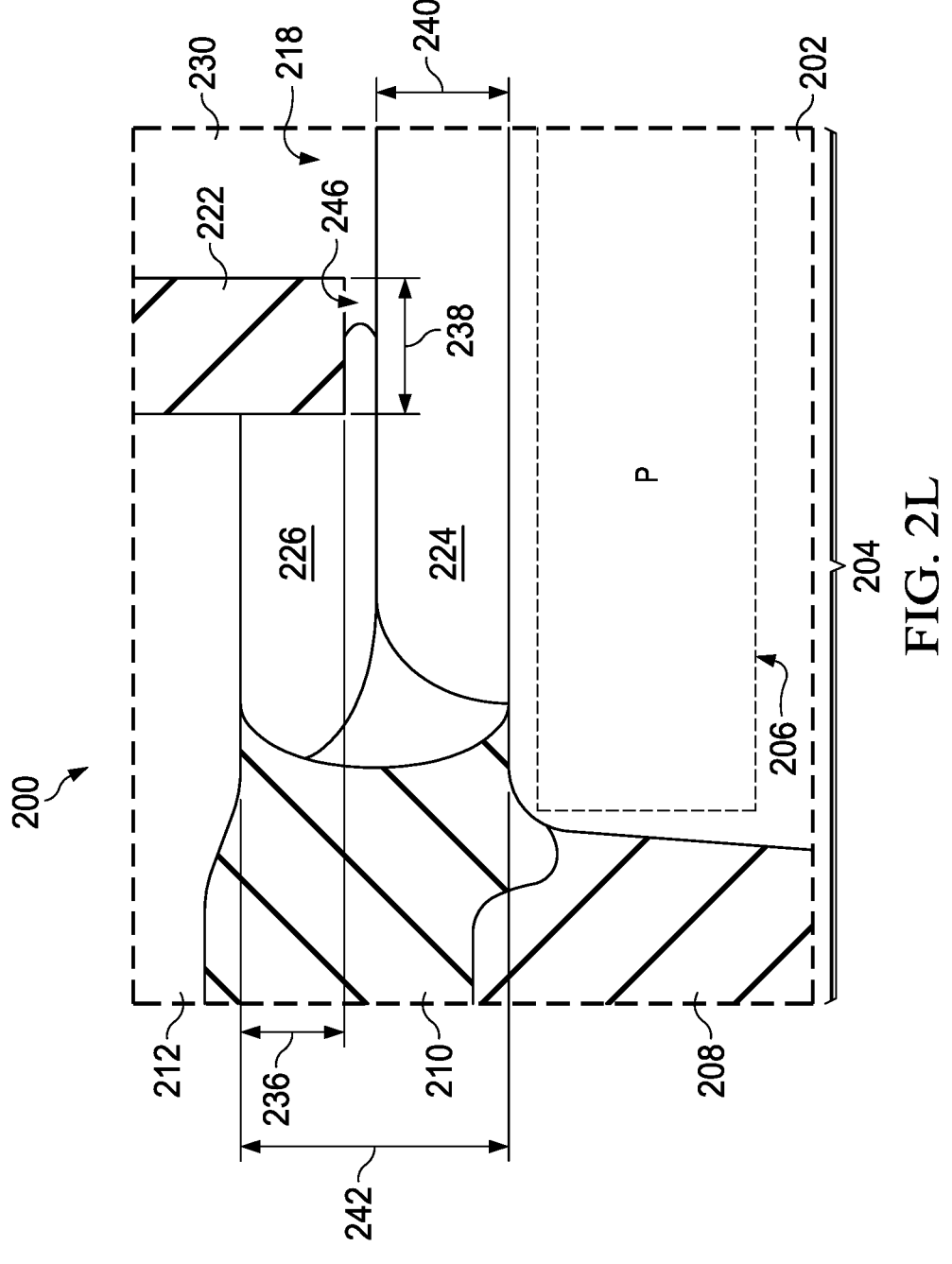

Referring to FIG. 2K and FIG. 2L, which is an enlarged view of a portion of FIG. 2K, an emitter 230 is formed in the emitter window 218, on the emitter spacer 222 and on the monocrystalline base layer 224 where exposed by the emitter spacer 222. The emitter 230 may extend outside the emitter window 218, as depicted in FIG. 2K. The emitter 230 of this example is monocrystalline, and includes primarily silicon. The emitter 230 has the first conductivity type, in this example, n-type. The emitter 230 may be formed by a silicon vapor phase epitaxy process. An emitter contact 232 makes a conductive connection to the emitter 230.

FIG. 2K and FIG. 2L depict the semiconductor device 200 of FIG. 1Q and FIG. 1R, with internal sublayers of the monocrystalline base layer 224 and the base link 226 omitted, in order to show dimensional relationships of the HBT 204 more clearly. That is, the base sublayers 224a and 224b, and the base link sublayers 226a and 226b are not shown in FIG. 2K and FIG. 2L.

The base link 226 laterally abuts the emitter spacer 222. In this example, a boundary between the extrinsic base layer 212 and the base link 226 may be flat and parallel to a top surface of the collector 206. In this example, the extrinsic base layer 212 may have a uniform thickness across the HBT 204. The HBT 204 has a spacer-extrinsic base vertical offset 236, which is a vertical distance between the bottom of the emitter spacer 222 and the bottom surface of the extrinsic base layer 212 adjacent to the emitter spacer 222. The emitter spacer 222 has a bottom width 238, which is a width of the emitter spacer 222 at the bottom of the emitter spacer 222, closest to the monocrystalline base layer 224. The monocrystalline base layer 224 has the monocrystalline base thickness 240, which is a thickness of the monocrystalline base layer 224 in the vertical direction. The spacer-extrinsic base vertical offset 236 of this example may be 50 percent to 75 percent of the monocrystalline base thickness 240, by way of example. The bottom width 238 of the emitter spacer 222 of this example may be 25 percent to 100 percent of the monocrystalline base thickness 240, by way of example. A sum of the spacer-extrinsic base vertical offset 236 and the bottom width 238 is greater than the monocrystalline base thickness 240, which may prevent polycrystalline material of the base link 226 from growing past the emitter spacer 222 into the emitter window 218, advantageously providing a consistent contact area between the emitter 230 and the monocrystalline base layer 224 and enabling a reduced area for the HBT 204, compared to an HBT with polycrystalline material protruding into the emitter window.

The base link 226 grows downward at approximately the same rate as the monocrystalline base layer 224 grows upward. A base link cavity height 242, which is a vertical distance between the collector 206 adjacent to the emitter spacer 222 and the extrinsic base layer 212, may be less than twice the monocrystalline base thickness 240, enabling complete contact between the base link 226 and the monocrystalline base layer 224. Complete contact between the base link 226 and the monocrystalline base layer 224 may advantageously provide a low resistance connection through the base link 226 between the extrinsic base layer 212 and the monocrystalline base layer 224. There may be a gap 246 between the bottom of the emitter spacer 222 and the instant top surface of the monocrystalline base layer 224 as the monocrystalline base layer 224 is grown, enabling access of epitaxy reagent gases, such as silane and germane, to the base link 226 as it is growing, further advantageously providing complete contact between the base link 226 and the monocrystalline base layer 224.

Figure 3A:
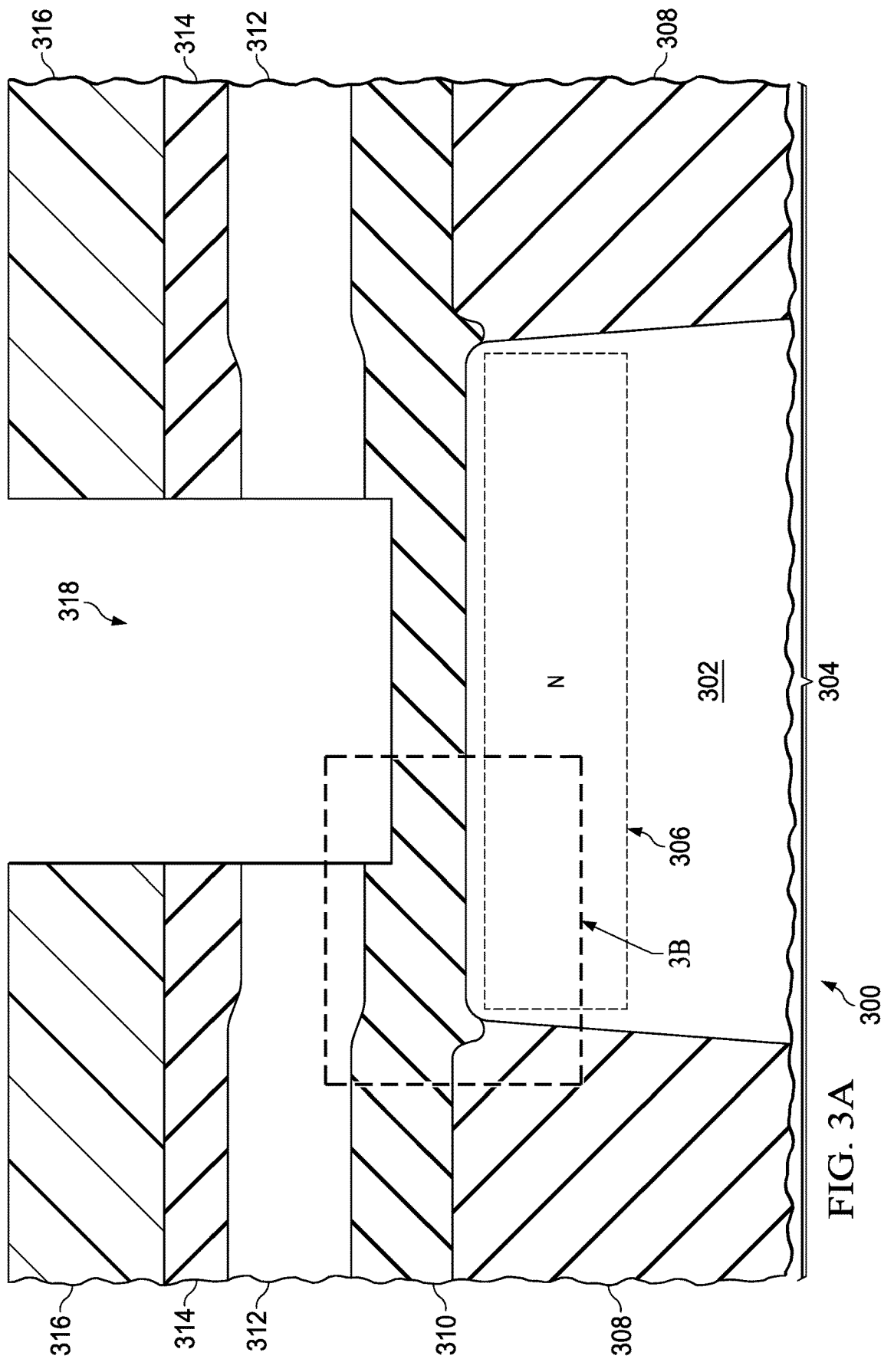
FIG. 3A through FIG. 3L are cross-sections of another example semiconductor device having an HBT, depicted in stages of another example method of formation.
Figure 3B:
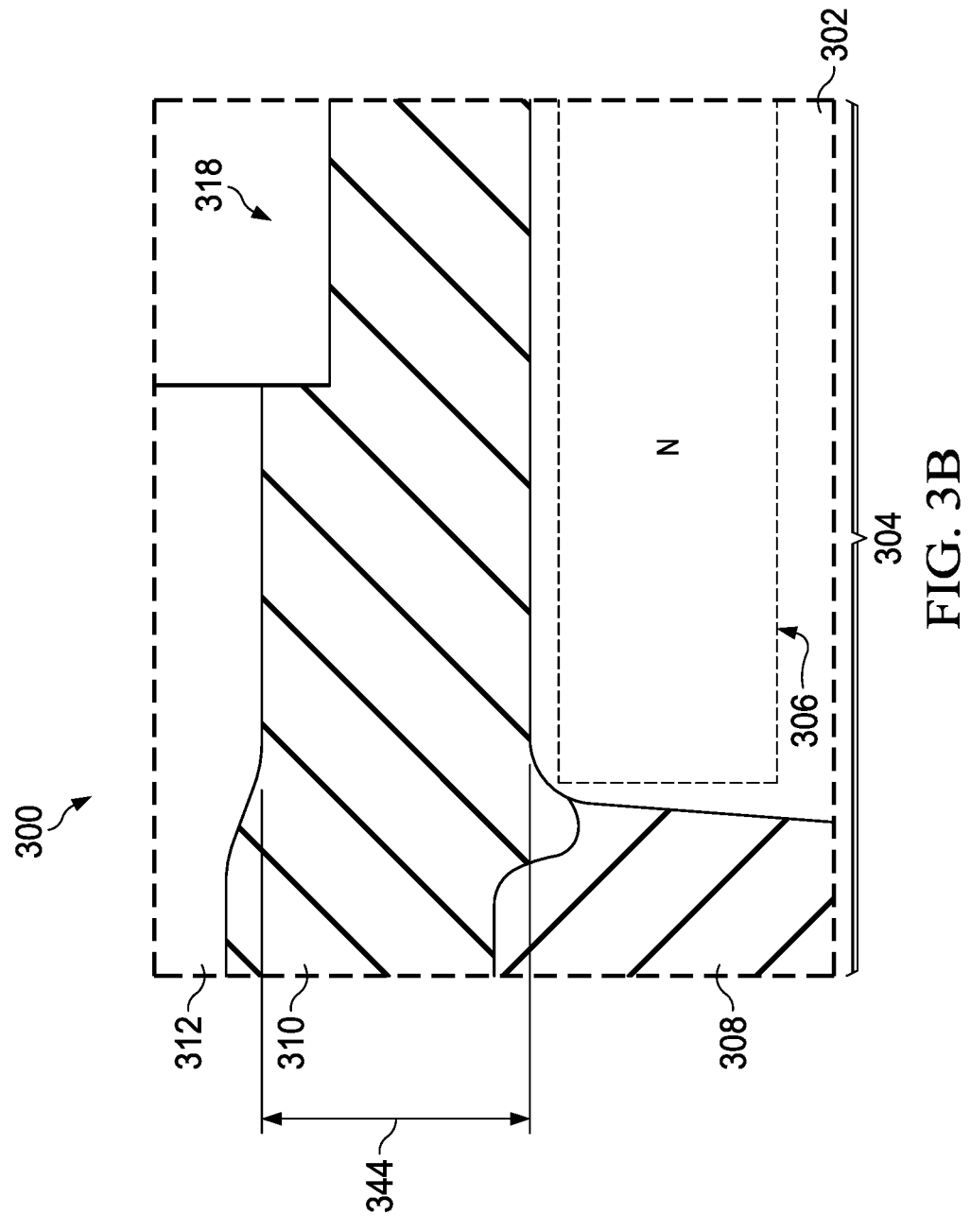

FIG. 3A through FIG. 3L are cross-sections of another example semiconductor device having an HBT, depicted in stages of another example method of formation. Referring to FIG. 3A and FIG. 3B, which is an enlarged view of a portion of FIG. 3A, the semiconductor device 300 includes a substrate 302 of monocrystalline silicon. The HBT 304 in this example is described as an NPN HBT. A PNP version of the HBT 304 may be formed by appropriate changes in conductivity types and dopant species. The HBT 304 includes a collector 306 having a first conductivity type, in the substrate 302. In this example, the first conductivity type is n-type. The collector 306 may be laterally isolated by field oxide 308.

A base spacer layer 310 is formed over the collector 306. The base spacer layer 310 may include primarily silicon dioxide. The base spacer layer 310 of this example may have a spacer thickness 344 that is, for example, 125 percent to 150 percent of a monocrystalline base thickness 340 of a monocrystalline base layer 324, not shown in FIG. 3A and FIG. 3B, formed in a later step and shown in FIG. 3I and FIG. 3J. An extrinsic base layer 312 is formed over the base spacer layer 310. The extrinsic base layer 312 includes polysilicon having a second conductivity type, opposite from the first conductivity type. In this example, the second conductivity type is p-type. A base-emitter separation dielectric layer 314 may be formed over the extrinsic base layer 312. The base-emitter separation dielectric layer 314 is electrically non-conductive.

An emitter window etch mask 316 is formed over the base-emitter separation dielectric layer 314, an opening exposing the base-emitter separation dielectric layer 314 in an area for an emitter window 318. The base-emitter separation dielectric layer 314 and the extrinsic base layer 312 are removed from the emitter window 318, where exposed by the opening in the emitter window etch mask 316. After the extrinsic base layer 312 is removed from the emitter window 318, a portion of the base spacer layer 310 is removed from the emitter window 318. The base-emitter separation dielectric layer 314, the extrinsic base layer 312, and the portion of the base spacer layer 310 may be removed by sequential RIE processes or ICP processes. A vertical depth of the portion of the base spacer layer 310 that is removed may be 25 percent to 50 percent of the monocrystalline base thickness 340 of the monocrystalline base layer 324, by way of example. After the base-emitter separation dielectric layer 314 and the extrinsic base layer 312 are removed from the emitter window 318, the emitter window etch mask 316 is removed.

Figure 3C:
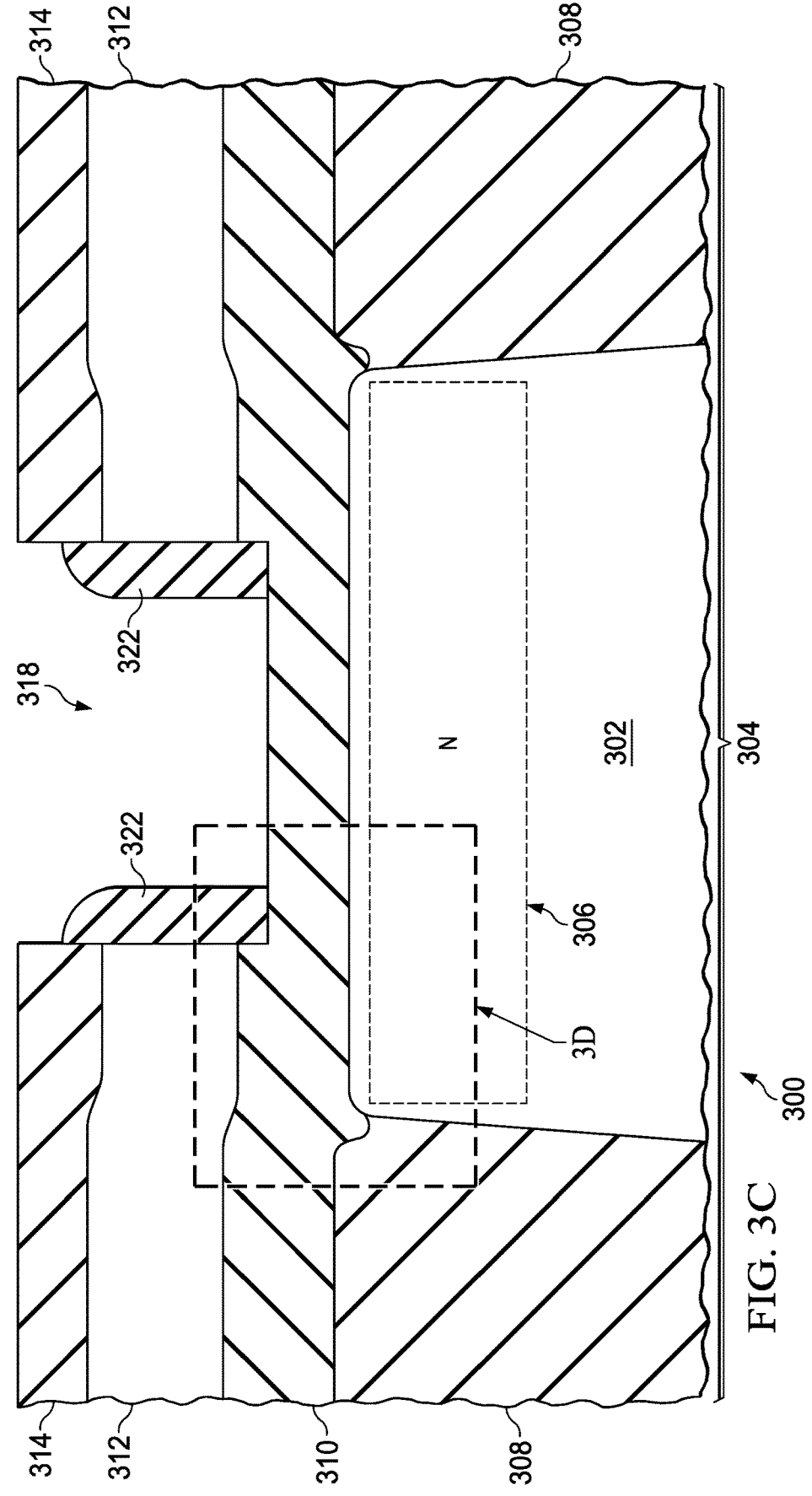
Figure 3D:
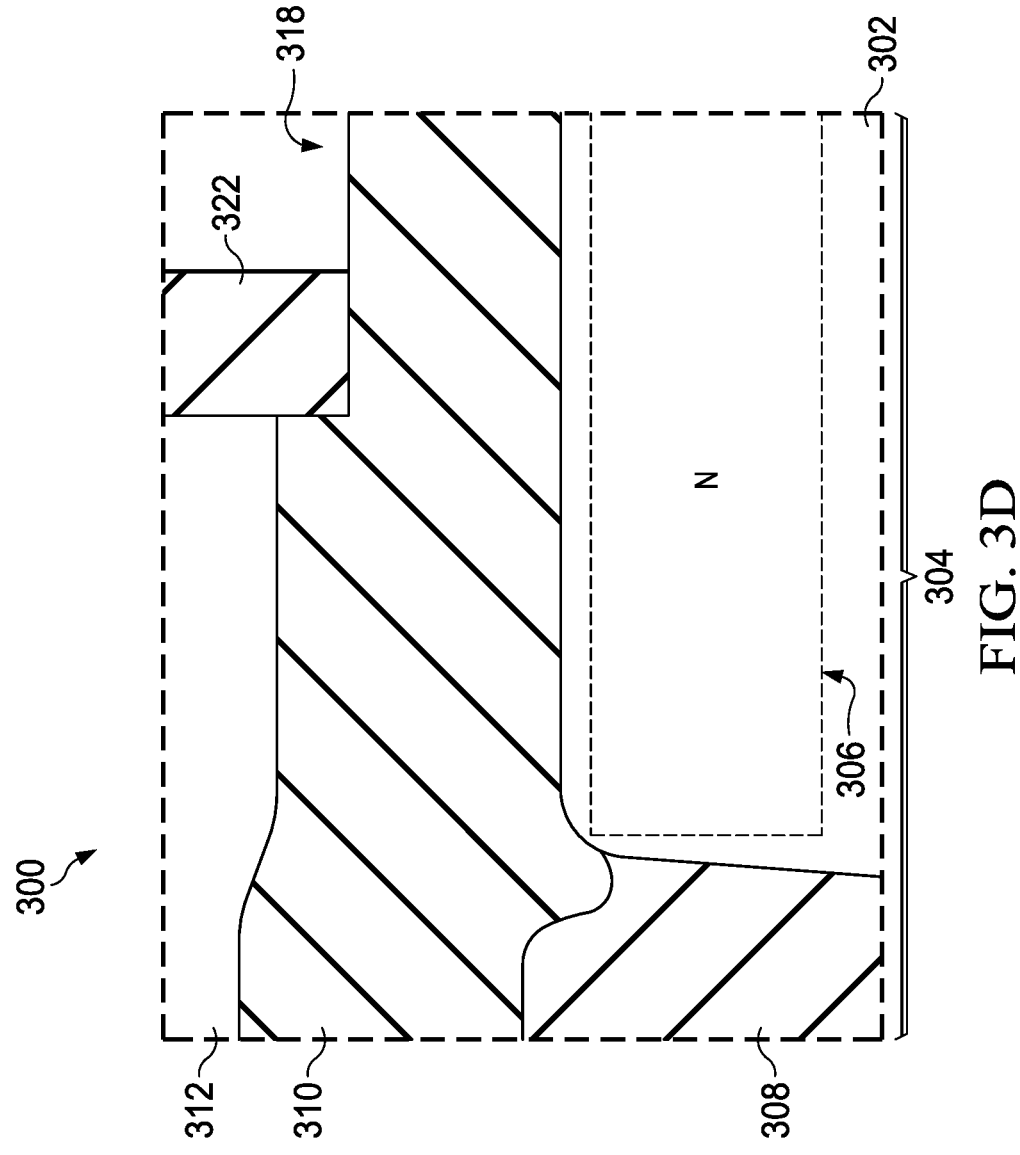

Referring to FIG. 3C and FIG. 3D, which is an enlarged view of a portion of FIG. 3C, an emitter spacer 322 is formed on sidewalls of the extrinsic base layer 312 in the emitter window 318. The emitter spacer 322 may be formed as disclosed in reference to the emitter spacer 122 of FIG. 1E through FIG. 1H. The emitter spacer 322 extends vertically past a bottom surface of the extrinsic base layer 312 adjacent to the emitter spacer 322.

Figure 3E:
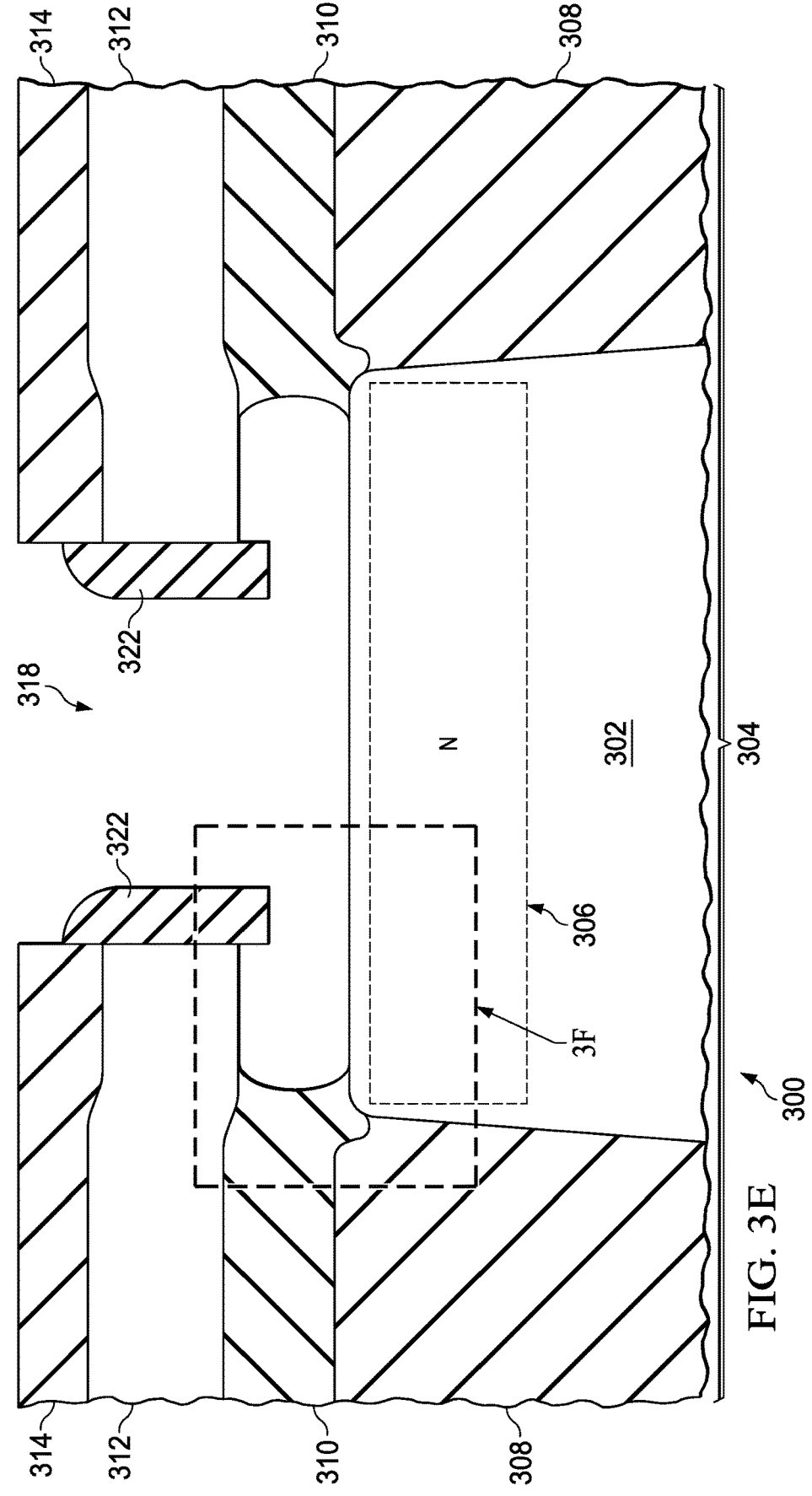
Figure 3F:
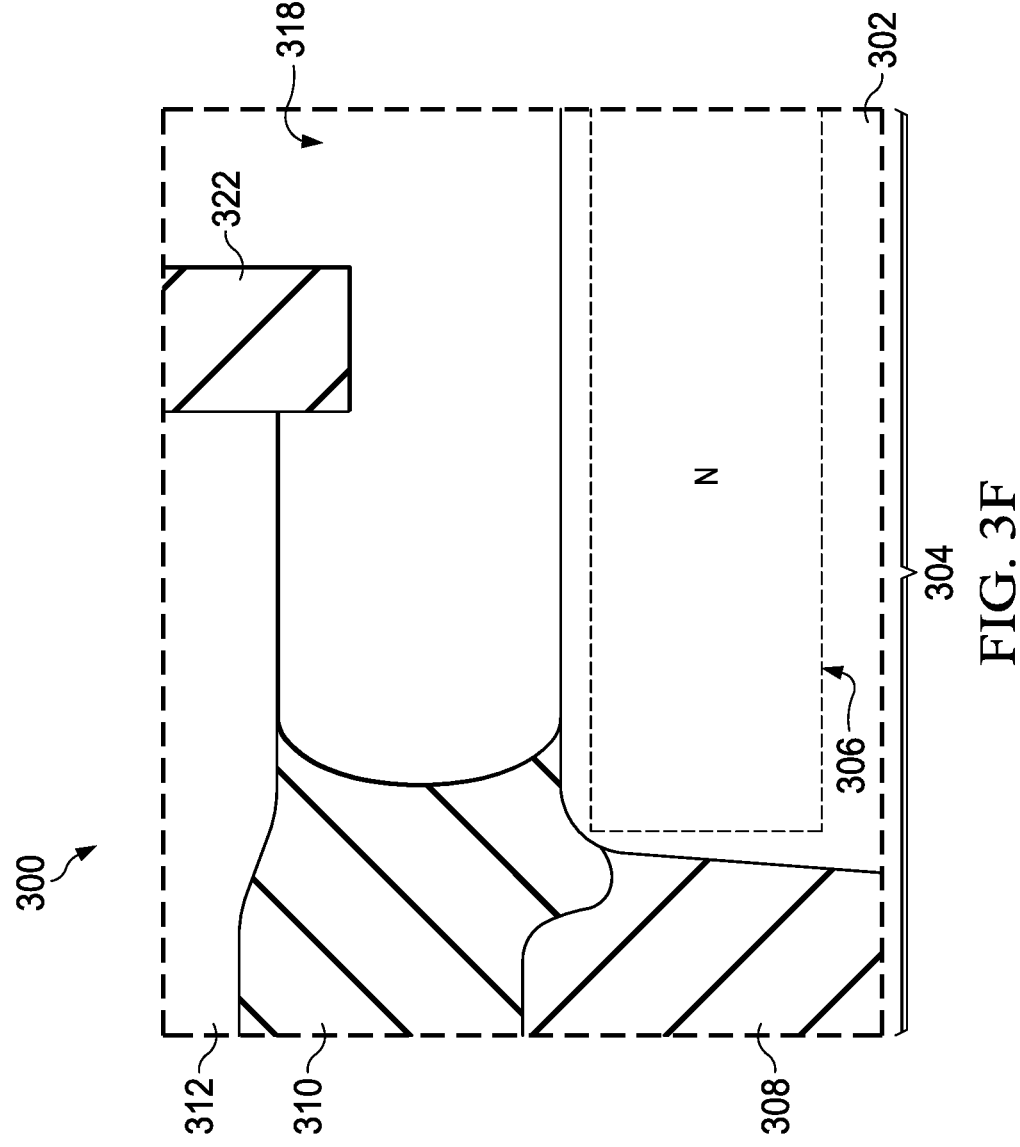

Referring to FIG. 3E and FIG. 3F, which is an enlarged view of a portion of FIG. 3E, a portion of the base spacer layer 310 is removed, exposing the collector 306, and exposing portions of the lower surfaces of the extrinsic base layer 312 adjacent to the emitter spacer 322. The portion of the base spacer layer 310 may be removed as disclosed in reference to FIG. 1I and FIG. 1J.

Figure 3G:
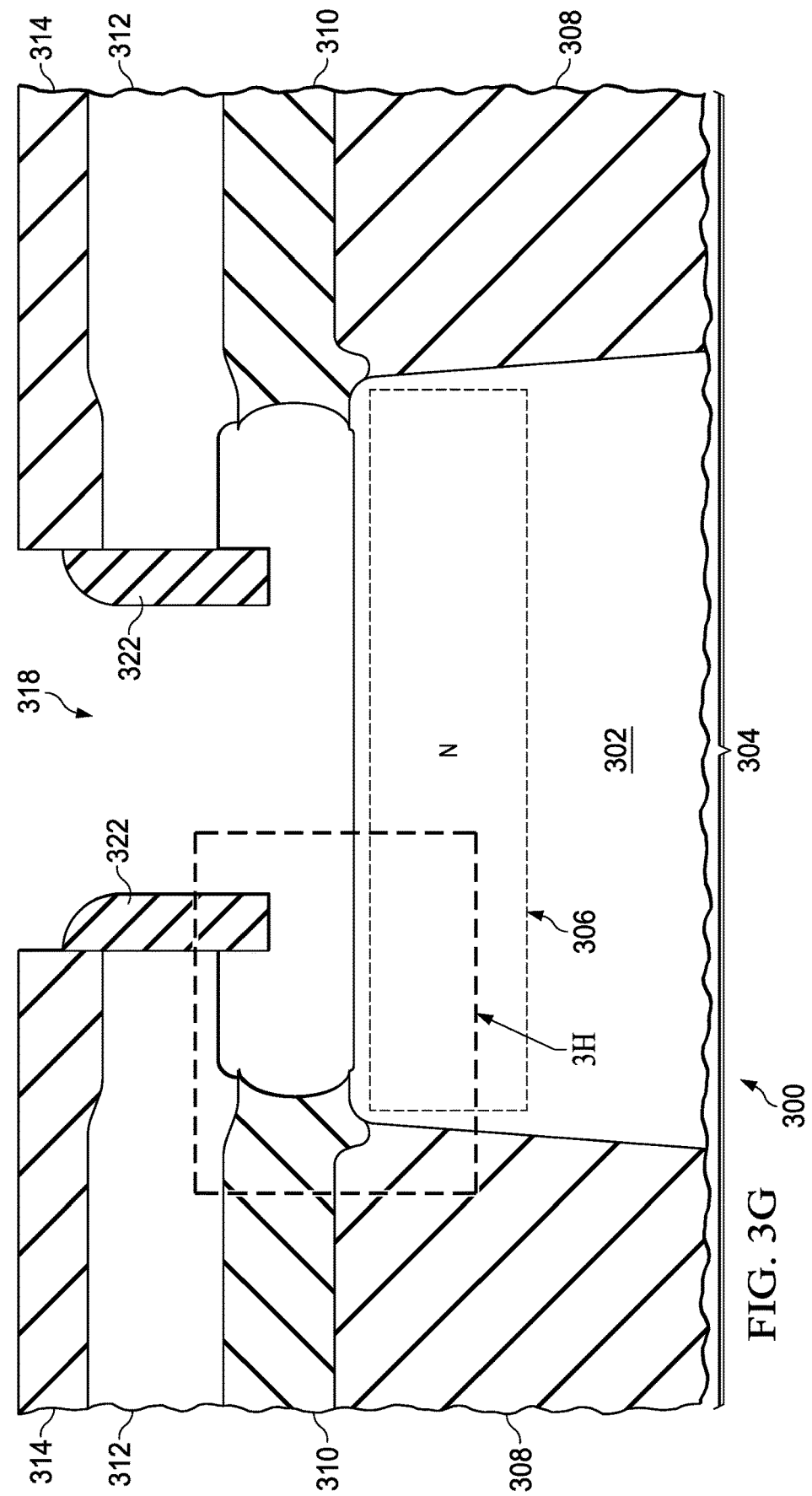
Figure 3H:
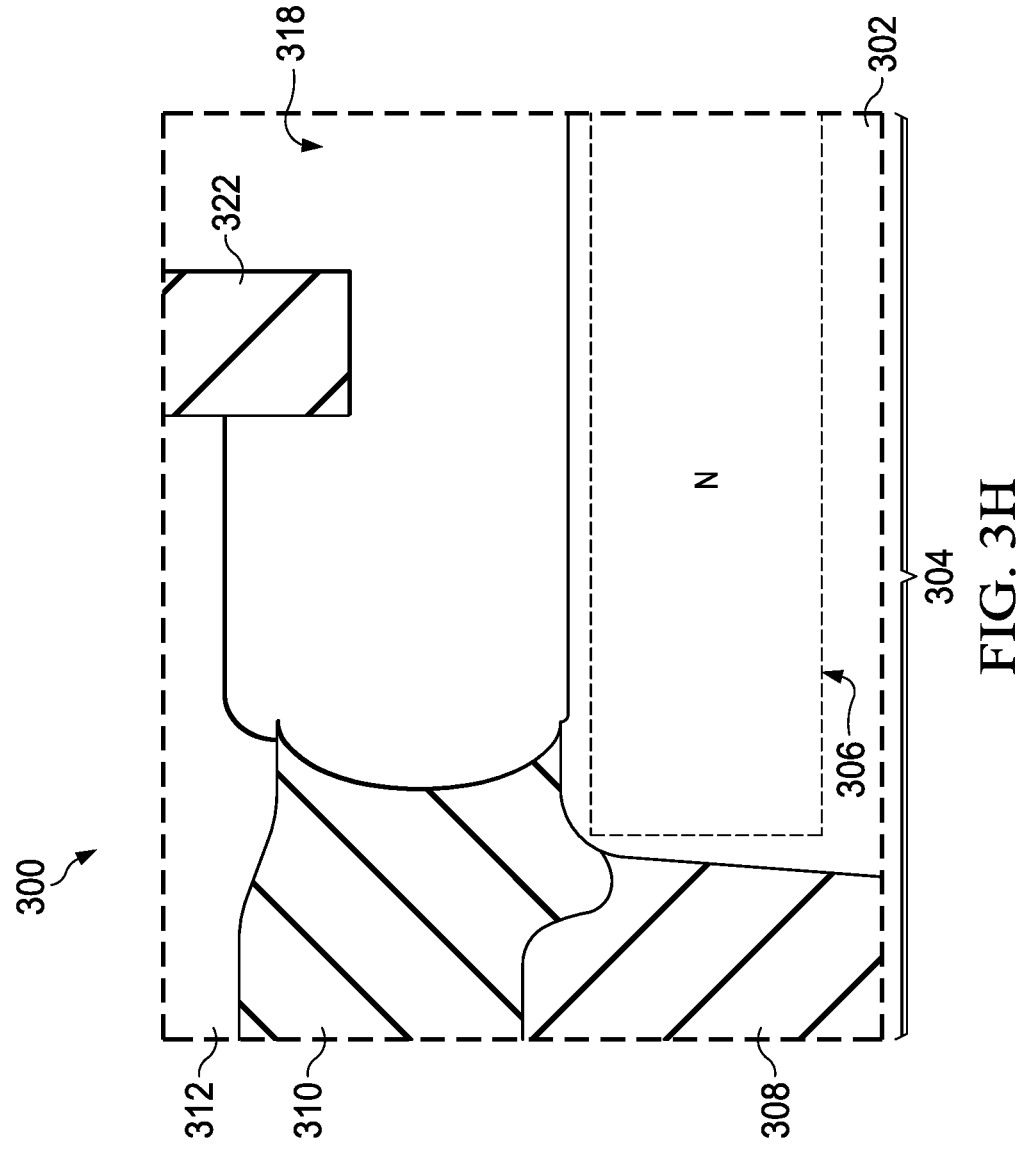

Referring to FIG. 3G and FIG. 3H, which is an enlarged view of a portion of FIG. 3G, a portion of the extrinsic base layer 312 is removed at the lower surface, adjacent to the emitter spacer 322, where exposed by the removal of the portion of the base spacer layer 310. The portion of the extrinsic base layer 312 may be removed as disclosed with respect to removal of the portion of the extrinsic base layer 112 in reference to FIG. 1K and FIG. 1L. A portion of the collector 306 may be removed by the vapor phase etch process, as depicted in FIG. 3G and FIG. 3H, concurrently with removal of the portion of the extrinsic base layer 312. A vertical thickness of the portion of the extrinsic base layer 312 that is removed may be 25 percent to 50 percent of the monocrystalline base thickness 340, in this example, shown in FIG. 3K and FIG. 3L, by way of example.

Figure 3I:
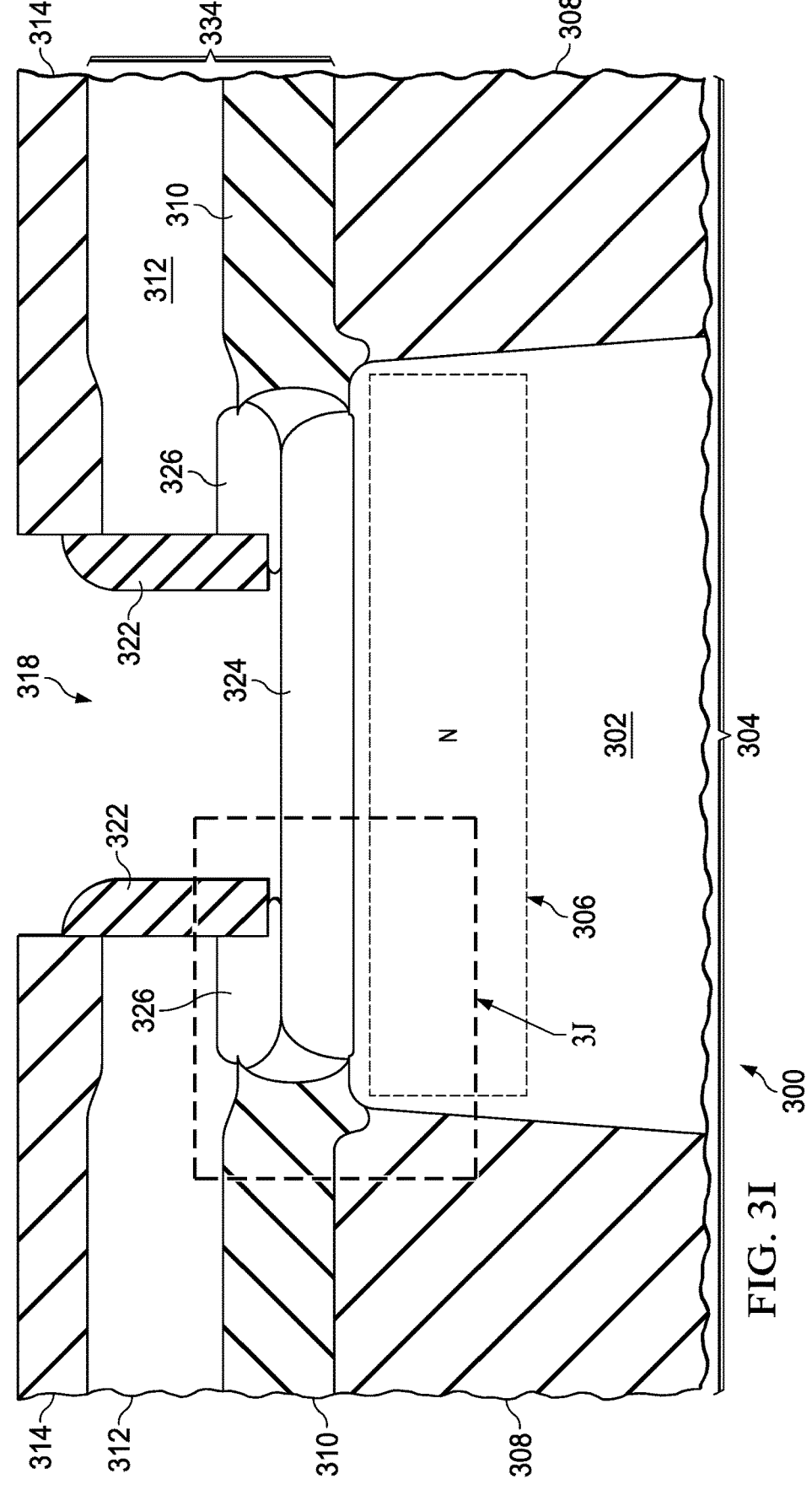
Figure 3J:
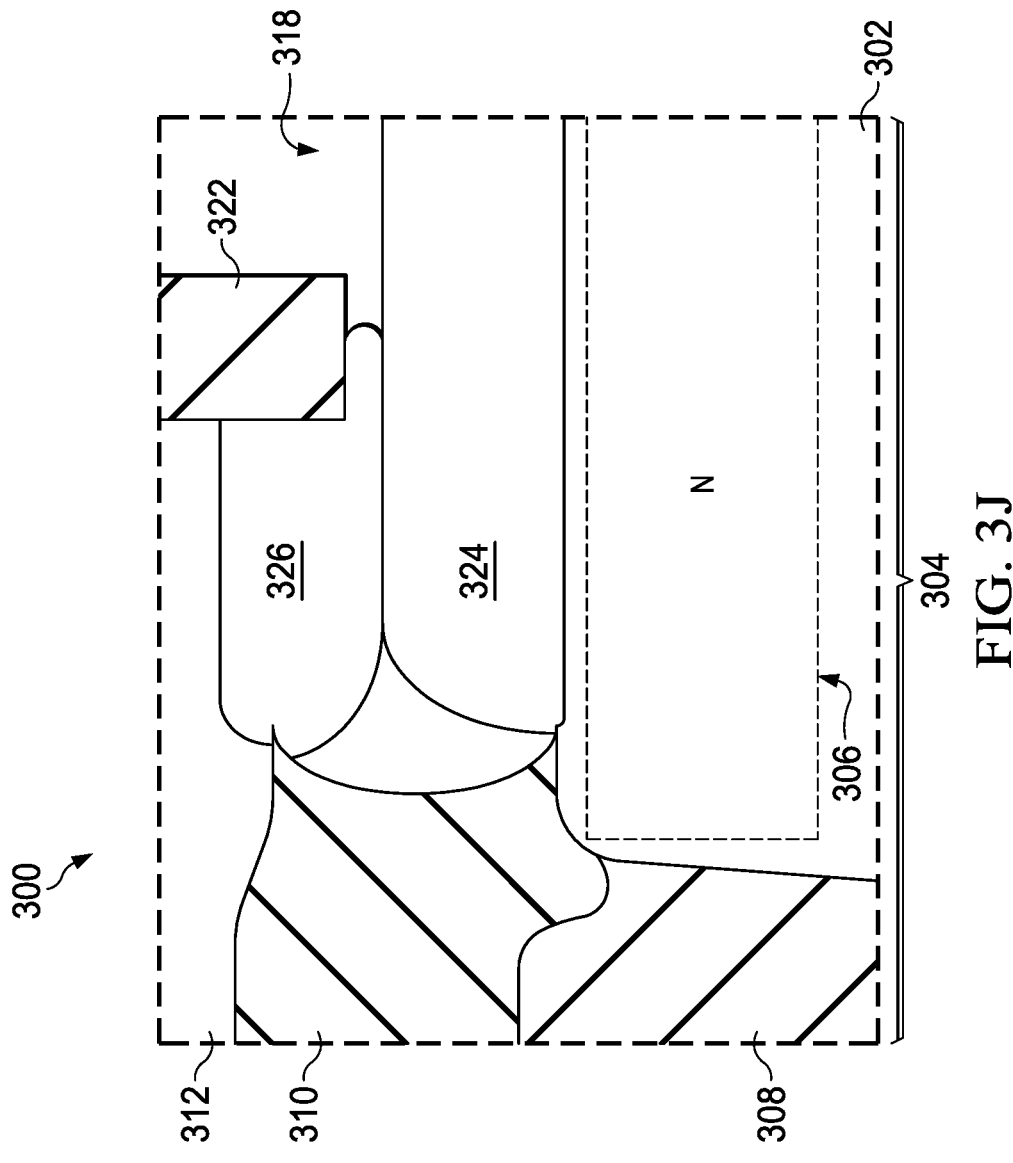

Referring to FIG. 3I and FIG. 3J, which is an enlarged view of a portion of FIG. 3I, a monocrystalline base layer 324 is formed over the collector 306, and a base link 326 is concurrently formed on the extrinsic base layer 312 at the lower surface, adjacent to the emitter spacer 322. The monocrystalline base layer 324 may include two or more base sublayers, and the base link 326 includes corresponding base link sublayers. The monocrystalline base layer 324 and the base link 326 may be formed by one or more vapor phase epitaxial processes. The monocrystalline base layer 324 is monocrystalline, has the second conductivity type, in this example, n-type, and includes silicon-germanium. The monocrystalline base layer 324 extends laterally past the emitter spacer 322, under the extrinsic base layer 312. The base link 326 is polycrystalline, and has a composition similar to the monocrystalline base layer 324, as a result of being formed concurrently with the monocrystalline base layer 324. The monocrystalline base layer 324 grows upward from the collector 306, while the base link 326 grows downward from the lower surface of the extrinsic base layer 312 at approximately the same rate as the monocrystalline base layer 324 to contact the monocrystalline base layer 324. The base link 326 connects the extrinsic base layer 312 to the monocrystalline base layer 324. The monocrystalline base layer 324, the base link 326, and the extrinsic base layer 312 provide a base 334 of the HBT 304.

Figure 3K:
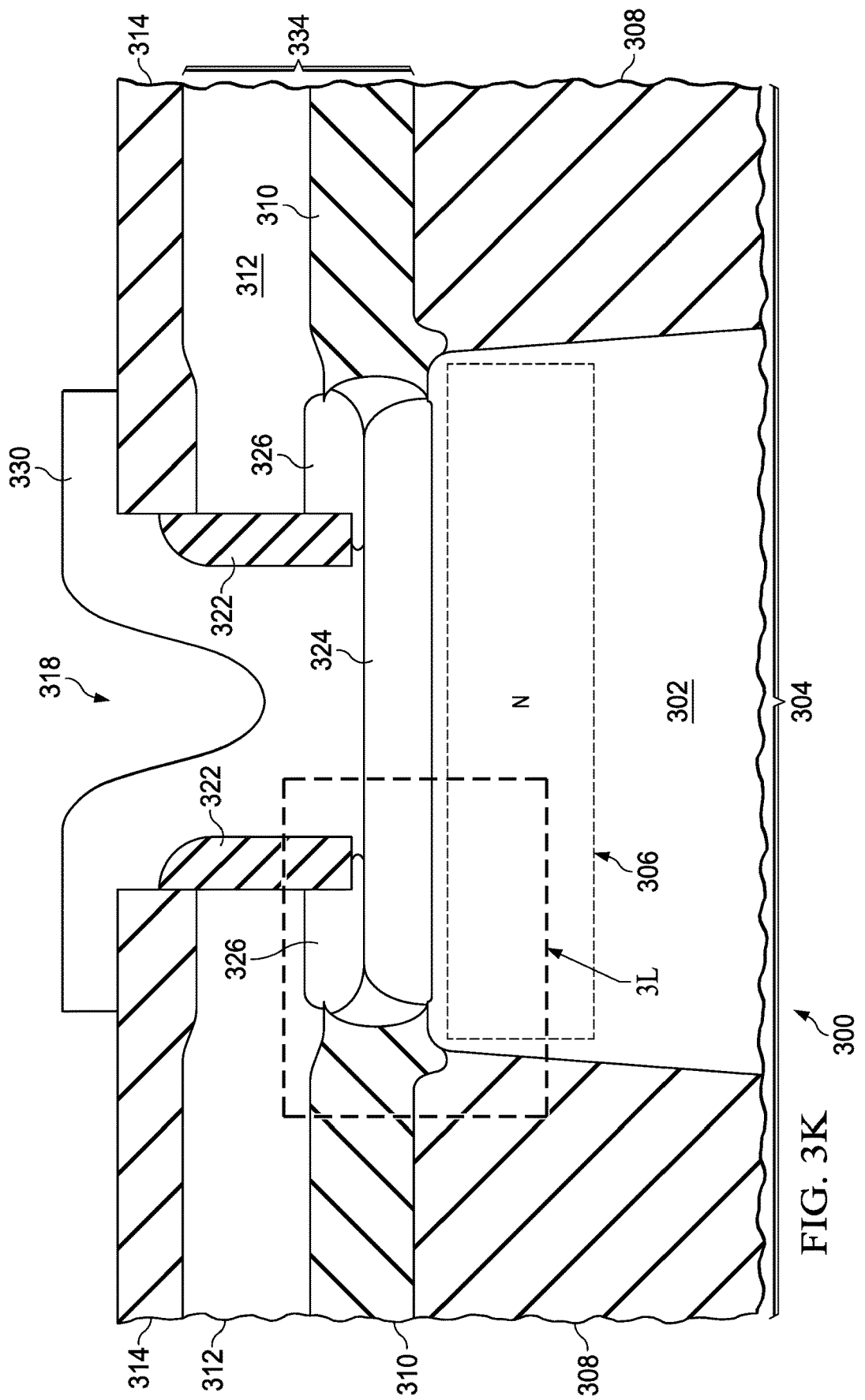
Figure 3L:
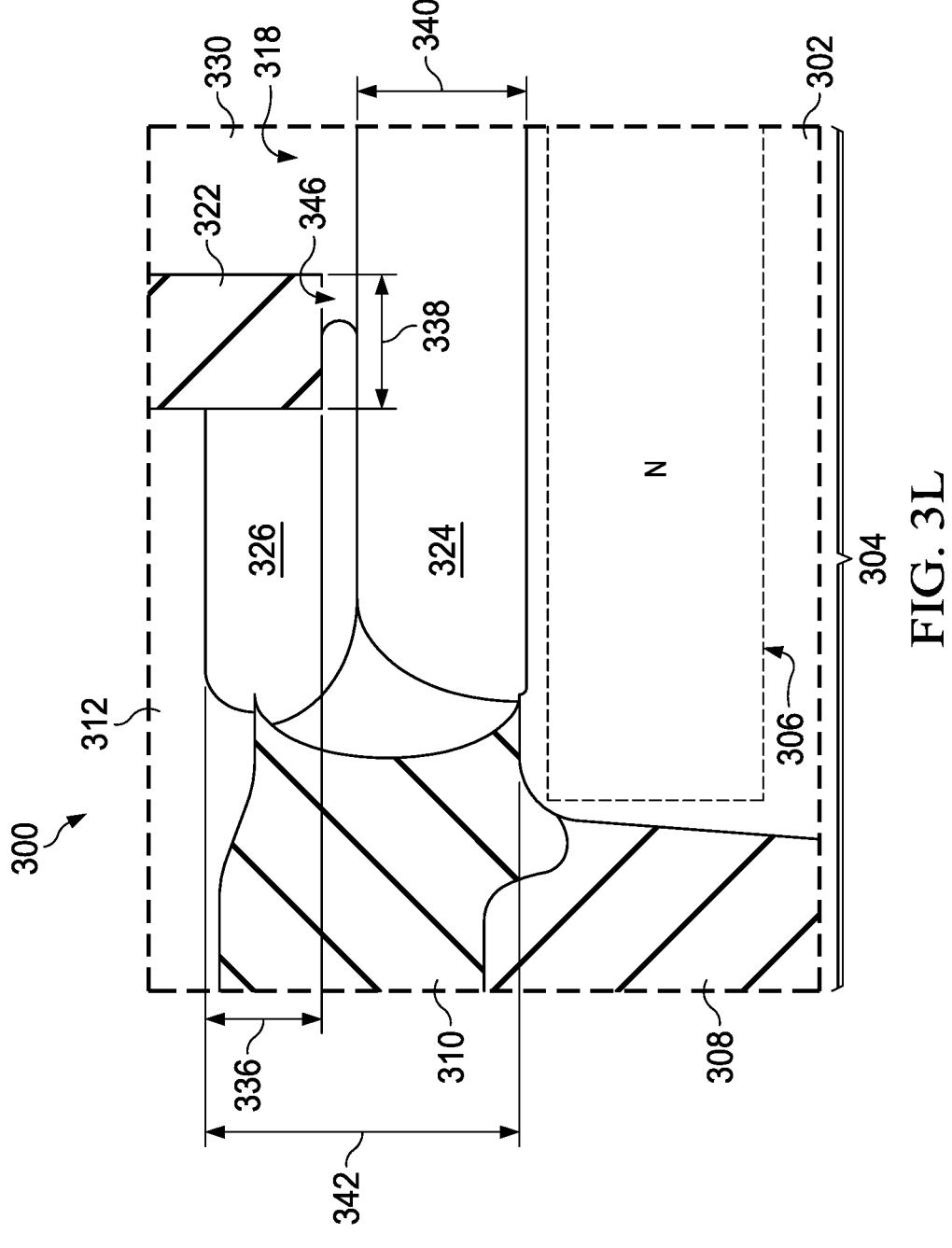

Referring to FIG. 3K and FIG. 3L, which is an enlarged view of a portion of FIG. 3K, an emitter 330 is formed in the emitter window 318, on the emitter spacer 322 and on the monocrystalline base layer 324 where exposed by the emitter spacer 322. The emitter 330 may extend outside the emitter window 318, as depicted in FIG. 3K. The emitter 330 of this example is monocrystalline, and includes primarily silicon. The emitter 330 has the first conductivity type, in this example, n-type. The emitter 330 may be formed by a silicon vapor phase epitaxy process. An emitter contact 332 makes a conductive connection to the emitter 330.

The base link 326 laterally abuts the emitter spacer 322. The HBT 304 has a spacer-extrinsic base vertical offset 336, which is a vertical distance between the bottom of the emitter spacer 322 and the bottom surface of the extrinsic base layer 312 adjacent to the emitter spacer 322. The emitter spacer 322 has a bottom width 338, which is a width of the emitter spacer 322 at the bottom of the emitter spacer 322, closest to the monocrystalline base layer 324. The monocrystalline base layer 324 has the monocrystalline base thickness 340, which is a thickness of the monocrystalline base layer 324 in the vertical direction. A sum of the spacer-extrinsic base vertical offset 336 and the bottom width 338 is greater than the monocrystalline base thickness 340, which may prevent polycrystalline material of the base link 326 from growing past the emitter spacer 322 into the emitter window 318, advantageously providing a consistent contact area between the emitter 330 and the monocrystalline base layer 324 and enabling a reduced area for the HBT 304, compared to an HBT with polycrystalline material protruding into the emitter window.

A base link cavity height 342, which is a vertical distance between the collector 306 adjacent to the emitter spacer 322 and the extrinsic base layer 312, may be less than twice the monocrystalline base thickness 340, enabling complete contact between the base link 326 and the monocrystalline base layer 324. Complete contact between the base link 326 and the monocrystalline base layer 324 may advantageously provide a low resistance connection through the base link 326 between the extrinsic base layer 312 and the monocrystalline base layer 324. There may be a gap 346 between the bottom of the emitter spacer 322 and the instant top surface of the monocrystalline base layer 324 as the monocrystalline base layer 324 is grown, enabling access of epitaxy reagent gases, such as silane and germane, to the base link 326 as it is growing, further advantageously providing complete contact between the base link 326 and the monocrystalline base layer 324.

Various features of the examples disclosed herein may be combined in other manifestations of example semiconductor devices. For example, any of the monocrystalline base layers 124, 224, and 324 may have one or more sublayers of monocrystalline silicon-germanium or silicon, with different dopant profiles and thicknesses. Any of the HBTs 104, 204, and 304 may be implemented as a PNP HBT or an NPN HBT. Any of the HBTs 104, 204, and 304 may include an emitter liner, or may be formed without an emitter liner. Any of the HBTs 104, 204, and 304 may be integrated with other electrical components such as FETs, resistors, capacitors or inductors over a common semiconductor substrate in an integrated circuit to implement an electronic function.

While various examples of the present disclosure have been described above, it should be understood that they have been presented by way of example only and not limitation. Numerous changes to the disclosed examples can be made in accordance with the disclosure herein without departing from the spirit or scope of the disclosure. Thus, the breadth and scope of the disclosure should not be limited by any of the above described examples. Rather, no particular result is a requirement unless explicitly recited in a particular claim.

What is claimed is:

1. A semiconductor device, comprising:
   a heterojunction bipolar transistor, including:
      a collector;
      a base on the collector, the base including:
         a monocrystalline base layer on the collector, the monocrystalline base layer including monocrystalline silicon-germanium;
         an extrinsic base layer extending partway over the monocrystalline base layer, the extrinsic base layer including polycrystalline silicon; and
         a base link including polycrystalline material connecting the monocrystalline base layer to the extrinsic base layer, the base link including polycrystalline silicon-germanium;
      an emitter on the base; and

an emitter spacer of dielectric material laterally separating the emitter from the extrinsic base layer, wherein:
      the monocrystalline base layer extends laterally from under the emitter past the emitter spacer, to under the extrinsic base layer;
      a sum of a spacer-extrinsic base vertical offset, between a bottom of the emitter spacer and a bottom surface of the extrinsic base layer adjacent to the emitter spacer, and a bottom width of the emitter spacer, is greater than a monocrystalline base thickness of the monocrystalline base layer; and
      the base link laterally abuts the emitter spacer opposite from the emitter.

2. The semiconductor device of claim 1, wherein a base link cavity height is less than twice the monocrystalline base thickness, the base link cavity height being a vertical distance between the collector and the extrinsic base layer adjacent to the emitter spacer.

3. The semiconductor device of claim 1, wherein a bottom surface of the extrinsic base layer is recessed and in contact with the base link.

4. The semiconductor device of claim 1, wherein a boundary between the extrinsic base layer and the base link is flat and parallel to a top surface of the collector.

5. The semiconductor device of claim 1, wherein the extrinsic base layer has a uniform thickness across the heterojunction bipolar transistor.

6. The semiconductor device of claim 1, wherein a vertical distance between the collector and the bottom of the emitter spacer is greater than the monocrystalline base thickness.

7. The semiconductor device of claim 1, wherein the monocrystalline base layer includes a sublayer of monocrystalline silicon over the monocrystalline silicon-germanium.

8. The semiconductor device of claim 1, wherein the emitter includes monocrystalline silicon on the monocrystalline base layer.

9. The semiconductor device of claim 7, further including an emitter liner between the emitter and the emitter spacer.

10. A method of forming a semiconductor device, comprising:
   forming a base spacer layer over a collector of a heterojunction bipolar transistor;
   forming a polycrystalline extrinsic base layer including silicon over the base spacer layer;
   exposing the base spacer layer in an emitter window;
   forming a dielectric emitter spacer on sidewalls of the extrinsic base layer in the emitter window, the emitter spacer extending to the base spacer layer;
   removing at least a portion of the base spacer layer, exposing the collector under the emitter window, and exposing portions of lower surfaces of the extrinsic base layer adjacent to the emitter spacer; and
   concurrently forming a monocrystalline base layer over the collector and forming a polycrystalline base link contacting the extrinsic base layer adjacent to the emitter spacer; wherein:
      the monocrystalline base layer includes silicon-germanium;
      the monocrystalline base layer extends laterally past the emitter spacer to under the extrinsic base layer;
      the base link contacts the monocrystalline base layer;
      the base link laterally abuts the emitter spacer opposite from the emitter window; and a sum of a spacer extrinsic base vertical offset, between a bottom of the emitter spacer and a bottom surface of the extrinsic base layer adjacent to the emitter spacer, and a bottom width of the emitter spacer, is greater than a monocrystalline base thickness of the monocrystalline base layer.

11. The method of claim 10, further including removing a portion of the extrinsic base layer from a bottom surface of the extrinsic base layer, adjacent to the emitter spacer, after removing at least the portion of the base spacer layer, and prior to concurrently forming the monocrystalline base layer and the base link.

12. The method of claim 11, wherein removing the portion of the extrinsic base layer uses a gas phase etchant including a halogen.

13. The method of claim 11, wherein removing the portion of the extrinsic base layer also removes a portion of the collector.

14. The method of claim 10, wherein exposing the base spacer layer in the emitter window includes removing a first portion of the base spacer layer in the emitter window, leaving a second portion of the base spacer layer over the collector in the emitter window.

15. The method of claim 14, wherein the emitter spacer extends past a boundary between the extrinsic base layer and the base spacer layer prior to removing at least the portion of the base spacer layer.

16. The method of claim 10, wherein exposing the base spacer layer in the emitter window includes removing the extrinsic base layer in the emitter window.

17. The method of claim 10, wherein forming the monocrystalline base layer includes maintaining a gap between the bottom of the emitter spacer and an instant top surface of the monocrystalline base layer, as the monocrystalline base layer is formed.

18. The method of claim 10, wherein forming the monocrystalline base layer includes forming a sublayer including monocrystalline silicon over monocrystalline silicon-germanium.

19. The method of claim 10, further including forming an emitter of monocrystalline silicon on the monocrystalline base layer in the emitter window.

20. The method of claim 19, further including forming an emitter liner on the monocrystalline base layer and the emitter spacer in the emitter window, the emitter liner exposing the monocrystalline base layer in the emitter window.

* * * * *